US012563895B2

(12) United States Patent
Yamazaki et al.

(10) Patent No.: US 12,563,895 B2
(45) Date of Patent: Feb. 24, 2026

(54) METHOD FOR MANUFACTURING DISPLAY APPARATUS, DISPLAY APPARATUS, DISPLAY MODULE, AND ELECTRONIC DEVICE

(71) Applicant: Semiconductor Energy Laboratory Co., Ltd., Atsugi (JP)

(72) Inventors: Shunpei Yamazaki, Setagaya (JP); Shingo Eguchi, Atsugi (JP); Tomoya Aoyama, Atsugi (JP); Daiki Nakamura, Atsugi (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 379 days.

(21) Appl. No.: 18/037,371

(22) PCT Filed: Nov. 25, 2021

(86) PCT No.: PCT/IB2021/060952
§ 371 (c)(1),
(2) Date: May 17, 2023

(87) PCT Pub. No.: WO2022/123382
PCT Pub. Date: Jun. 16, 2022

(65) Prior Publication Data
US 2023/0420614 A1 Dec. 28, 2023

(30) Foreign Application Priority Data
Dec. 7, 2020 (JP) ................................. 2020-202379

(51) Int. Cl.
*H10K 59/12* (2023.01)
*H10K 59/80* (2023.01)
*H10K 71/20* (2023.01)

(52) U.S. Cl.
CPC ....... *H10K 59/1201* (2023.02); *H10K 59/873* (2023.02); *H10K 71/231* (2023.02)

(58) Field of Classification Search
CPC .... H10K 71/166; H10K 71/20; H10K 71/231; H10K 71/233; H10K 59/1201;
(Continued)

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | |
|---|---|---|
| CN | 001239395 A | 12/1999 |
| CN | 108574057 A | 9/2018 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Eduardo A Rodela
(74) *Attorney, Agent, or Firm* — Eric J. Robinson; Robinson Intellectual Property Law Office, P.C.

(57) ABSTRACT

A high-resolution, high-definition, or large display apparatus is provided. A metal mask is placed over an EL layer and film deposition is performed with the metal mask, whereby an island-shaped counter electrode is formed. Then, the EL layer is processed using the counter electrode as a hard mask. Alternatively, after an EL layer and a counter electrode are formed over an entire surface, processing using a metal mask is performed. An insulating layer that electrically insulates adjacent pixel electrodes from each other is positioned between adjacent light-emitting devices. A resist (Continued)

mask is formed over the insulating layer. A plurality of EL layers and a plurality of counter electrodes overlapping each other over the insulating layer are partly removed using the resist mask, whereby part of the insulating layer is exposed. Thus, the adjacent light-emitting devices are electrically insulated from each other over the insulating layer.

12 Claims, 21 Drawing Sheets

(58) Field of Classification Search
 CPC .. H10K 59/121; H10K 59/122; H10K 59/873; H10K 59/35; H10K 59/87; H10K 71/60; H10K 71/621; H10K 71/16; H10K 71/236; H05B 33/10; H05B 33/12
 See application file for complete search history.

(56) References Cited

U.S. PATENT DOCUMENTS

| | | | |
|---|---|---|---|
| 6,146,715 A | 11/2000 | Kim et al. | |
| 10,608,064 B2 * | 3/2020 | Lee | H10K 59/122 |
| 11,678,550 B2 | 6/2023 | Kato | |
| 2002/0072139 A1 | 6/2002 | Kashiwabara | |
| 2009/0179210 A1 * | 7/2009 | Cok | H10K 71/221 |
| | | | 257/E33.001 |
| 2011/0148290 A1 | 6/2011 | Oota | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1 | 4/2013 | Hamaguchi et al. | |
| 2013/0084664 A1 | 4/2013 | Yoshitoku et al. | |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2014/0004640 A1 | 1/2014 | Hamaguchi et al. | |
| 2014/0004642 A1 | 1/2014 | Otsuka et al. | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2018/0261792 A1 | 9/2018 | Kwon et al. | |
| 2020/0057330 A1 | 2/2020 | Yamazaki et al. | |
| 2020/0203662 A1 | 6/2020 | Mollard et al. | |
| 2021/0265432 A1 | 8/2021 | Kato | |
| 2022/0130918 A1 | 4/2022 | Yamazaki et al. | |

FOREIGN PATENT DOCUMENTS

| | | |
|---|---|---|
| CN | 109509765 A | 3/2019 |
| CN | 112314056 A | 2/2021 |
| EP | 0066182 A | 12/1999 |
| JP | 2000-012220 A | 1/2000 |
| JP | 2000-036385 A | 2/2000 |
| JP | 2000-113982 A | 4/2000 |
| JP | 2003-059663 A | 2/2003 |
| JP | 2003-347053 A | 12/2003 |
| JP | 2008-098106 A | 4/2008 |
| JP | 2008-147072 A | 6/2008 |
| JP | 2008-251270 A | 10/2008 |
| JP | 2010-008317 A | 1/2010 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| KR | 2000-0002154 A | 1/2000 |
| KR | 2018-0104227 A | 9/2018 |
| WO | WO-2018/087625 | 5/2018 |
| WO | WO-2020/004086 | 1/2020 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2021/060952) dated Mar. 22, 2022.

Written Opinion (Application No. PCT/IB2021/060952) dated Mar. 22, 2022.

* cited by examiner 111a  113a  101  111b  121  111c

190a 111a  113a  101  111b  121  111c

190a

115a

114a 111a  113a  101  111b  121  111c

115a

114a 111a  113a  101  111b  121  111c

FIG. 3A
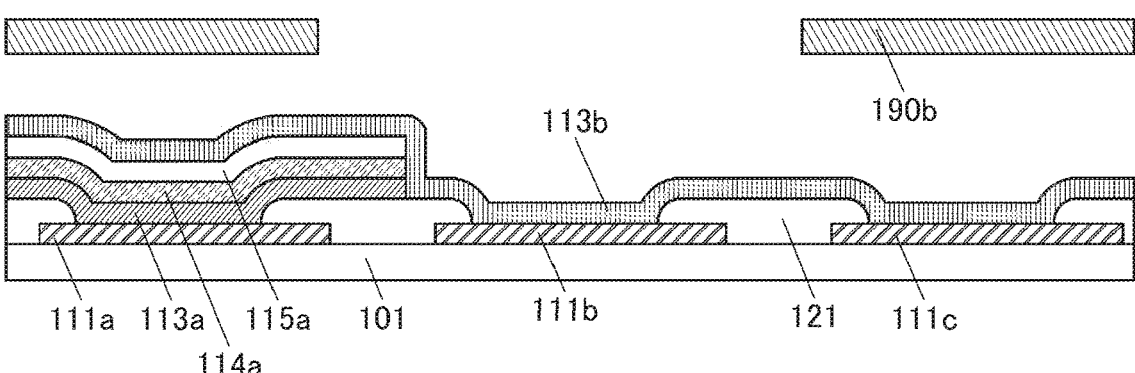
FIG. 3B
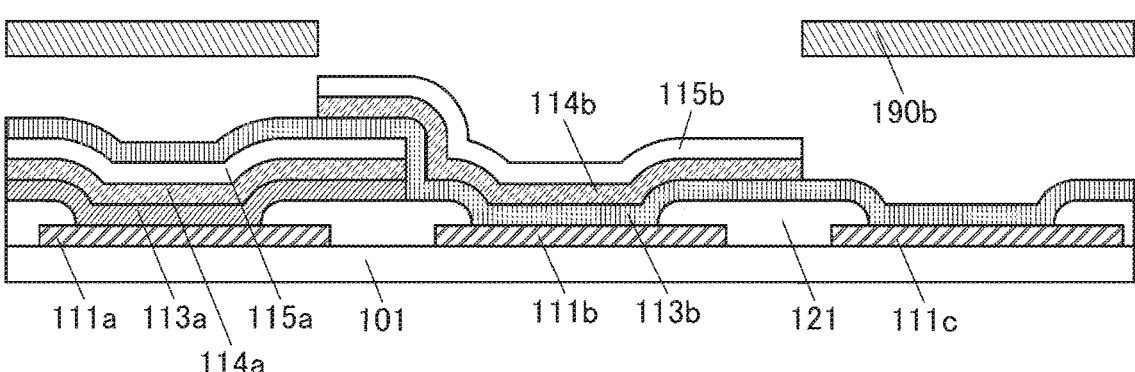
FIG. 3C
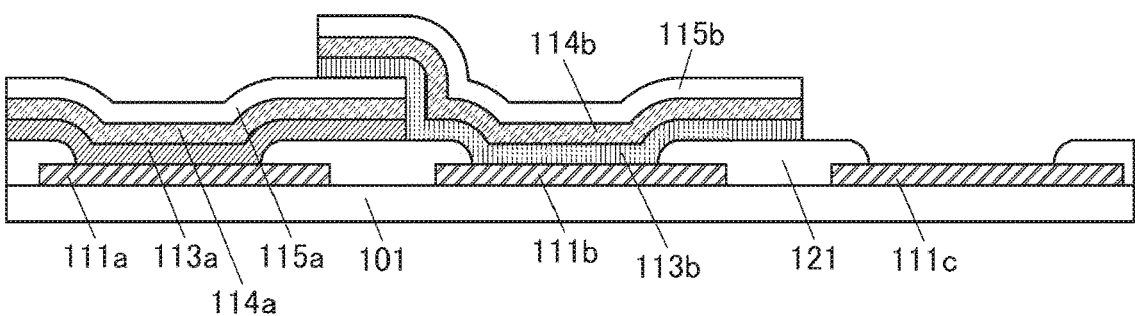
FIG. 3D 111a 113a 115a 101 111b 113b 115b 121 111c 113c 115c
114a 114b 114c 111a 113a 115a 101 111b 113b 115b 121 111c 113c 115c
114a 114b 114c 111a 113a 115a 101 111b 113b 115b 121 111c 113c 115c
114a 114b 114c 111a 113a 115a 101 111b 113b 115b 121 111c 113c 115c
114a 114b 114c 111a  113a  115a  101     111b          121  111c
       114a 190a 111a  113a  115a  101     111b          121  111c
       114a 190a 111a  113a  115a  101     111b          121  111c
       114a 115a 114a 111a  113a  101     111b          121  111c 111a  113a  115a  101        111b        121   111c
      114a 111a  113a  115a  101        111b        121   111c
      114a 111a  113a  115a    101    111b  113b  115b    121  111c  113c  115c
      114a                         114b                  114c 190c 111a  113a  115a    101    111b  113b  115b    121  111c  113c  115c
      114a                         114b                  114c 190c 111a  113a  115a    101    111b  113b  115b    121  111c  113c  115c
      114a                         114b                  114c 114a  115a                    115b            114c  115c 114b          113c 111a  113a    101      111b  113b    121  111c

100A

6001

6005

6006

6000

6009

6010

6011

6002

6000

6018

6001

6017a 6015    6006    6010     6011    6009    6016    6002

6017b

FIG. 19A
FIG. 19B
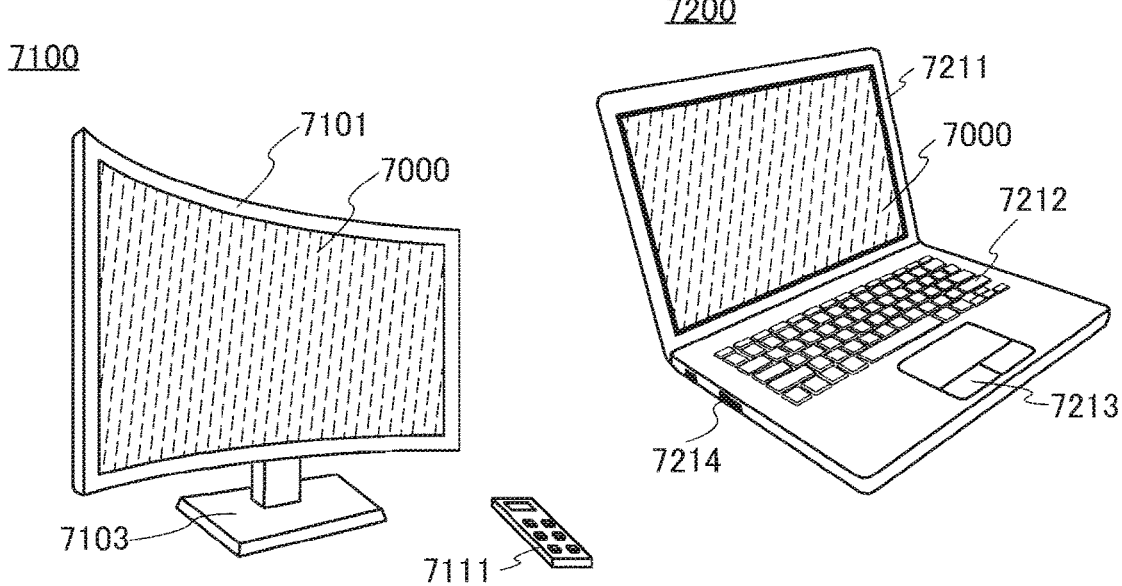
FIG. 19C
FIG. 19D
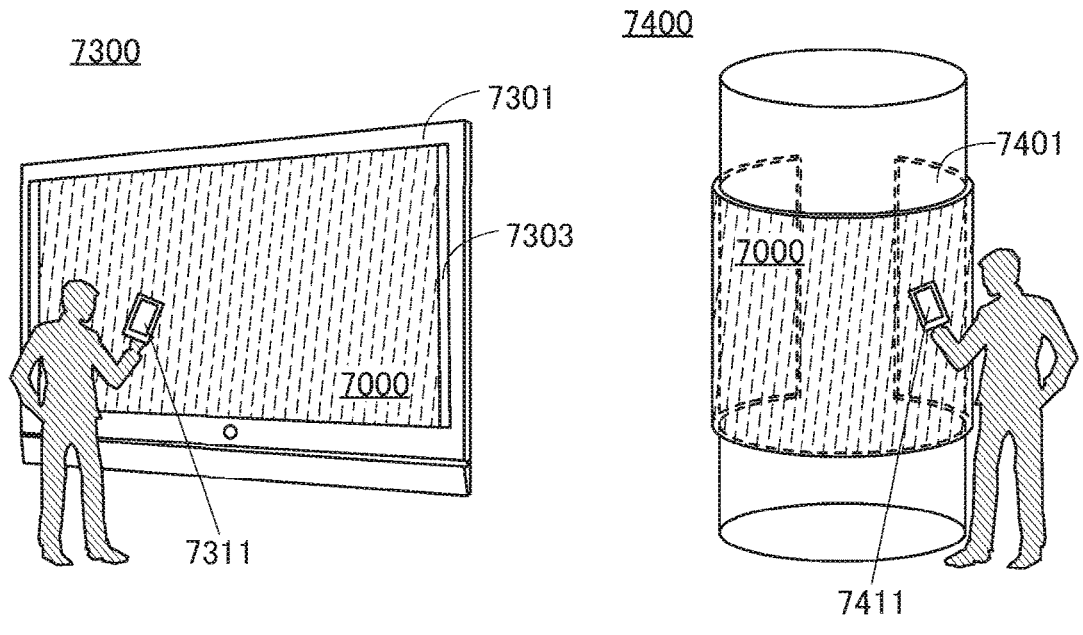

FIG. 20A
8100
8101
8102
8006
8103
8004
8001
8002
8000
8003
FIG. 20B
8200
8201
8202
8206
8205
8203
8204
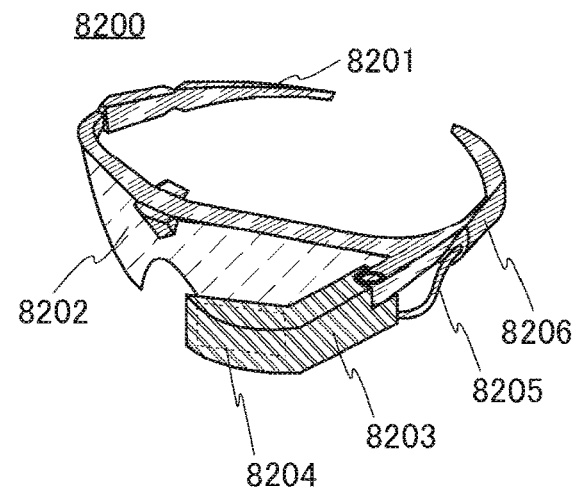
FIG. 20C
8300
8301
8304
8304
FIG. 20D
8300
8301
8305
8302
8304
8304  8305
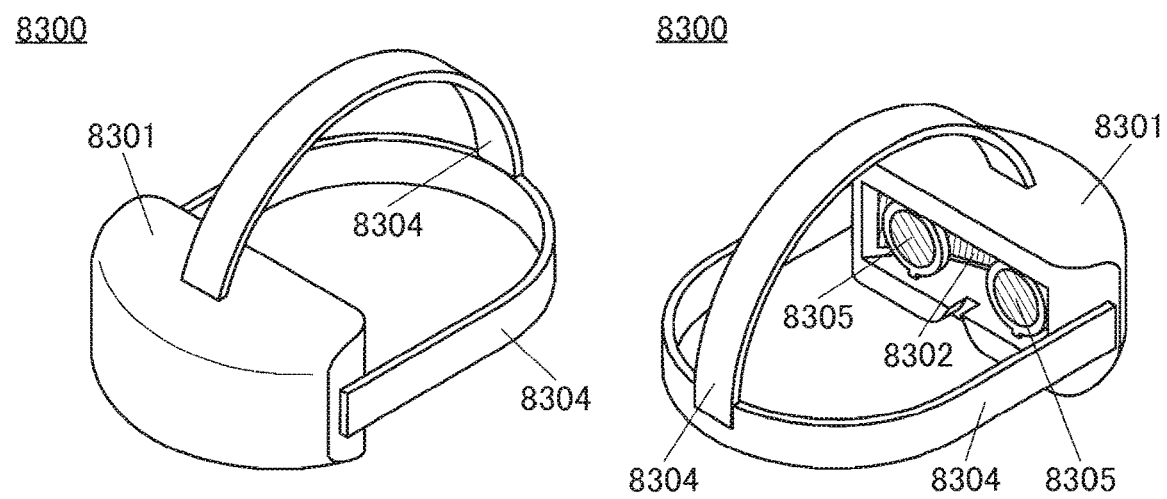
FIG. 20E
8300
8305  8301
8302
8305
FIG. 20F
8400
8402
8403
8405
8401
8404
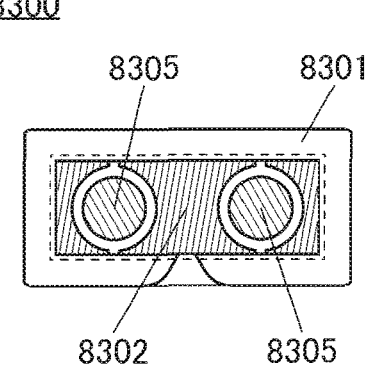
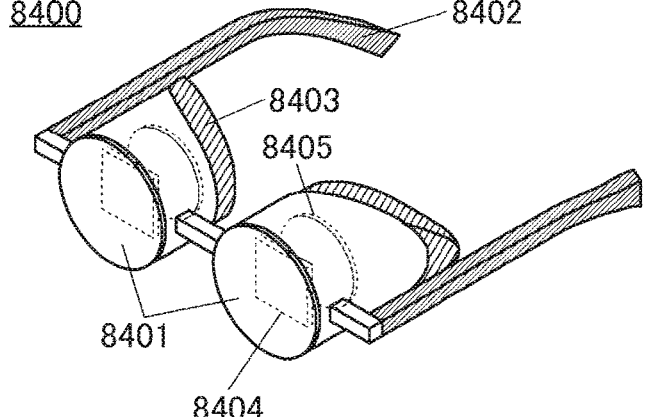

9101

9102

9200

9201

9201

9201

METHOD FOR MANUFACTURING DISPLAY APPARATUS, DISPLAY APPARATUS, DISPLAY MODULE, AND ELECTRONIC DEVICE

TECHNICAL FIELD

One embodiment of the present invention relates to a method for manufacturing a display apparatus. One embodiment of the present invention relates to a display apparatus, a display module, and an electronic device.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for manufacturing any of them.

BACKGROUND ART

In recent years, display apparatuses have been expected to be applied to a variety of uses. Examples of uses for a large display apparatus include a television device for home use (also referred to as a TV or a television receiver), digital signage, and a PID (Public Information Display). In addition, a smartphone, a tablet terminal, and the like including a touch panel are being developed as portable information terminals.

Furthermore, higher resolution of display apparatuses have been required. For example, devices for virtual reality (VR), augmented reality (AR), substitutional reality (SR), or mixed reality (MR) are given as devices requiring high-resolution display apparatuses and have been actively developed.

Light-emitting apparatuses including light-emitting devices (also referred to as light-emitting elements) have been developed as display apparatuses, for example. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses.

Patent Document 1 discloses a display apparatus using an organic EL device (also referred to as an organic EL element) for VR.

REFERENCE

Patent Document

[Patent Document 1] PCT International Publication No. 2018/087625

SUMMARY OF THE INVENTION

Problems to be Solved by the Invention

In the case of manufacturing a display apparatus including a plurality of organic EL devices emitting light of different colors from each other, light-emitting layers emitting light of different colors each need to be formed in an island shape.

For example, an island-shaped light-emitting layer can be formed by a vacuum evaporation method using a metal mask (also referred to as a shadow mask). However, the outline of the layer may blur during vapor deposition, whereby the thickness of an end portion may be small. That is, the thickness of an island-shaped light-emitting layer may vary from area to area. In the case of manufacturing a display apparatus with a large size, high definition, or high resolution, the manufacturing yield might be reduced because of low dimensional accuracy of the metal mask and deformation due to heat or the like.

A light-emitting layer can be processed into an island shape by a photolithography method. In that case, while variations in the thickness of the light-emitting layer can be inhibited, the manufacturing cost of the photomask is high. For example, in the case where a photolithography process is performed three times to manufacture a display apparatus including three colors, red (R), green (G), and blue (B), of subpixels, three kinds of photomasks need to be formed, which significantly increases the manufacturing cost of the display apparatus.

An object of one embodiment of the present invention is to provide a method for manufacturing a high-resolution display apparatus. An object of one embodiment of the present invention is to provide a method for manufacturing a high-definition display apparatus. An object of one embodiment of the present invention is to provide a method for manufacturing a large display apparatus. An object of one embodiment of the present invention is to provide a method for manufacturing a highly reliable display apparatus. An object of one embodiment of the present invention is to provide a method for manufacturing a display apparatus at a low manufacturing cost.

An object of one embodiment of the present invention is to provide a high-resolution display apparatus. An object of one embodiment of the present invention is to provide a high-definition display apparatus. An object of one embodiment of the present invention is to provide a large display apparatus. An object of one embodiment of the present invention is to provide a highly reliable display apparatus. An object of one embodiment of the present invention is to provide a display apparatus at a low manufacturing cost.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a method for manufacturing a display apparatus, including: forming a first pixel electrode and a second pixel electrode; forming an insulating layer covering an end portion of the first pixel electrode and an end portion of the second pixel electrode; forming a first layer over the first pixel electrode, the second pixel electrode, and the insulating layer; placing a first metal mask including a first opening over the first layer so that the first opening overlaps the first pixel electrode; forming a first counter electrode overlapping the first pixel electrode with the first layer therebetween by performing film deposition with the first metal mask; removing at least part of a region overlapping the second pixel electrode of the first layer using the first counter electrode as a hard mask; forming a second layer over the first pixel electrode, the second pixel electrode, and the insulating layer; placing a second metal mask including a second opening over the second layer so that the second opening overlaps the second pixel electrode; forming a second counter electrode overlapping the second pixel electrode with the second layer therebetween by performing film deposition with the second metal mask; removing at least part of a region overlapping the first pixel electrode of the second layer using the second counter electrode as a hard mask; forming, over the first counter electrode and the second counter electrode, a resist mask including an opening at a position overlapping the insulating layer; exposing part of the insulating layer by removing at least part of a region overlapping the insulating layer of at least one of the first layer, the second layer, the first counter electrode, and the second counter electrode using the resist mask; and forming a first protective layer covering the first counter electrode, the second counter electrode, and the insulating layer.

Before the formation of the first counter electrode, a second protective layer overlapping the first pixel electrode with the first layer therebetween may be formed by performing film deposition with the first metal mask. Before the formation of the second counter electrode, a third protective layer overlapping the second pixel electrode with the second layer therebetween may be formed by performing film deposition with the second metal mask. A thickness of the second protective layer and a thickness of the third protective layer may be different from each other.

At least one of a metal oxide layer including indium, gallium, and zinc and a metal oxide layer including indium and tin may be formed as each of the second protective layer and the third protective layer.

After the formation of the first counter electrode, a fourth protective layer overlapping the first pixel electrode with the first counter electrode therebetween may be formed by performing film deposition with the first metal mask. At least one of a metal oxide layer including indium, gallium, and zinc and a metal oxide layer including indium and tin may be formed as the fourth protective layer.

One embodiment of the present invention is a method for manufacturing a display apparatus, including: forming a first pixel electrode and a second pixel electrode; forming an insulating layer covering an end portion of the first pixel electrode and an end portion of the second pixel electrode; forming a first layer over the first pixel electrode, the second pixel electrode, and the insulating layer; forming a first counter electrode over the first layer; placing a first metal mask including a first opening over the first counter electrode so that the first opening overlaps the second pixel electrode; removing at least part of a region overlapping the second pixel electrode of the first layer and the first counter electrode using the first metal mask; forming a second layer over the first pixel electrode, the second pixel electrode, and the insulating layer; forming a second counter electrode over the second layer; placing a second metal mask including a second opening over the second counter electrode so that the second opening overlaps the first pixel electrode; removing at least part of a region overlapping the first pixel electrode of the second layer and the second counter electrode using the second metal mask; forming, over the first counter electrode and the second counter electrode, a resist mask including an opening at a position overlapping the insulating layer; exposing part of the insulating layer by removing at least part of a region overlapping the insulating layer of at least one of the first layer, the second layer, the first counter electrode, and the second counter electrode using the resist mask; and forming a first protective layer covering the first counter electrode, the second counter electrode, and the insulating layer.

A second protective layer may be formed over the first layer before the formation of the first counter electrode. A third protective layer may be formed over the second layer before the formation of the second counter electrode. A thickness of the second protective layer and a thickness of the third protective layer may be different from each other.

At least one of a metal oxide layer including indium, gallium, and zinc and a metal oxide layer including indium and tin may be formed as each of the second protective layer and the third protective layer.

A fourth protective layer may be formed over the first counter electrode before the placement of the first metal mask. At least one of a metal oxide layer including indium, gallium, and zinc and a metal oxide layer including indium and tin may be formed as the fourth protective layer.

One embodiment of the present invention is a display apparatus including a first light-emitting device, a second light-emitting device, an insulating layer, and a first protective layer. The first light-emitting device includes a first pixel electrode, a first layer over the first pixel electrode, and a first counter electrode over the first layer. The second light-emitting device includes a second pixel electrode, a second layer over the second pixel electrode, and a second counter electrode over the second layer. The first light-emitting device and the second light-emitting device are configured to emit light of different colors from each other. The insulating layer covers an end portion of the first pixel electrode and an end portion of the second pixel electrode. The first protective layer covers the first light-emitting device, the second light-emitting device, and the insulating layer. The insulating layer includes a first region overlapping with the first layer, the first counter electrode, the second layer, the second counter electrode, and the first protective layer and a second region in contact with the first protective layer.

The first light-emitting device may include a second protective layer between the first layer and the first counter electrode. The second light-emitting device may include a third protective layer between the second layer and the second counter electrode. A thickness of the second protective layer and a thickness of the third protective layer may be different from each other.

The second protective layer and the third protective layer may each include at least one of a metal oxide layer including indium, gallium, and zinc and a metal oxide layer including indium and tin.

The first light-emitting device may include a fourth protective layer over the first counter electrode. The fourth protective layer may include at least one of a metal oxide layer including indium, gallium, and zinc and a metal oxide layer including indium and tin.

One embodiment of the present invention is a display module including the display device having any of the above-described structures and is, for example, a display module provided with a connector such as a flexible printed circuit (hereinafter referred to as an FPC) or a TCP (Tape Carrier Package), or a display module on which an integrated circuit (IC) is mounted by a COG (Chip On Glass) method, a COF (Chip On Film) method, or the like.

One embodiment of the present invention is an electronic device including the above-described display module and at least one of an antenna, a battery, a housing, a camera, a speaker, a microphone, and an operation button.

Effect of the Invention

With one embodiment of the present invention, a method for manufacturing a high-resolution display apparatus can be provided. With one embodiment of the present invention, a method for manufacturing a high-definition display apparatus can be provided. With one embodiment of the present invention, a method for manufacturing a large display apparatus can be provided. With one embodiment of the present invention, a method for manufacturing a highly reliable display apparatus can be provided. With one embodiment of the present invention, a method for manufacturing a display apparatus at a low manufacturing cost can be provided.

With one embodiment of the present invention, a high-resolution display apparatus can be provided. With one embodiment of the present invention, a high-definition display apparatus can be provided. With one embodiment of the present invention, a large display apparatus can be provided. With one embodiment of the present invention, a highly reliable display apparatus can be provided. With one embodiment of the present invention, a display apparatus at a low manufacturing cost can be provided.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 3A to FIG. 3D are cross-sectional views illustrating the example of the method for manufacturing the display apparatus.

FIG. 8A to FIG. 8D are cross-sectional views illustrating the example of the method for manufacturing the display apparatus.

FIG. 19A to FIG. 19D are diagrams illustrating examples of electronic devices.

FIG. 20A to FIG. 20F are diagrams illustrating examples of electronic devices.

MODE FOR CARRYING OUT THE INVENTION

Figure 1A:
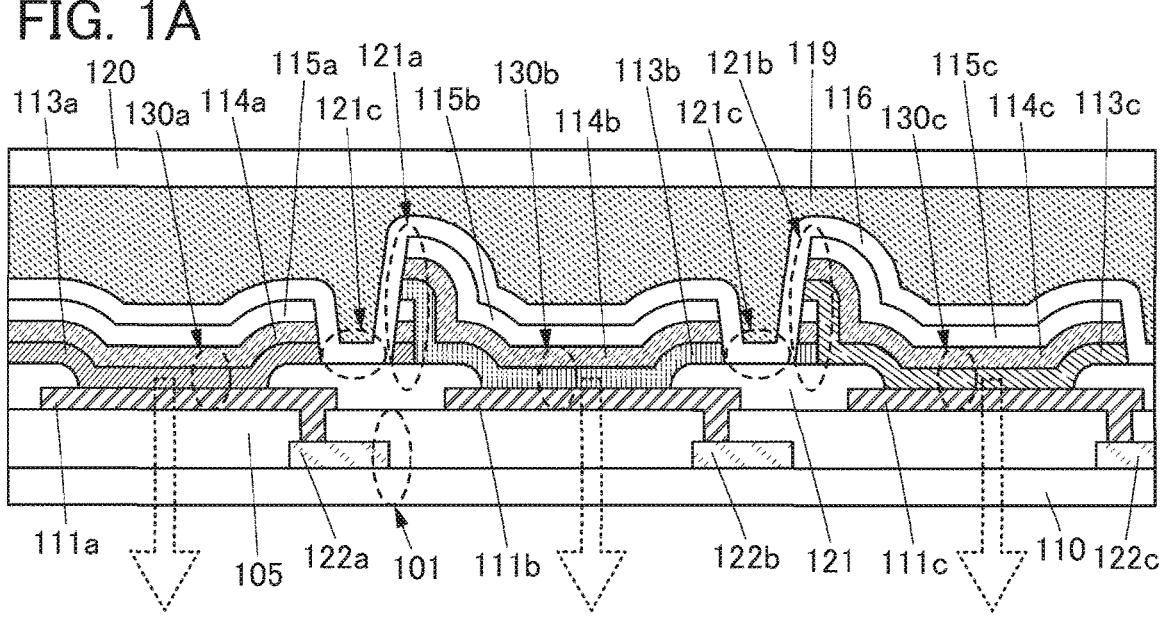
FIG. 1A and FIG. 1B are cross-sectional views illustrating examples of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

In this specification and the like, a device formed using a metal mask or an FMM (a fine metal mask, a high resolution metal mask) may be referred to as a device having a metal mask (MM) structure. In this specification and the like, a device formed without using a metal mask or an FMM may be referred to as a device having a metal maskless (MML) structure.

Embodiment 1

In this embodiment, a display apparatus of one embodiment of the present invention and a manufacturing method thereof are described with reference to FIG. 1 to FIG. 9.

In a method for manufacturing a display apparatus of one embodiment of the present invention, an island-shaped pixel electrode (also referred to as a lower electrode) is formed, an insulating layer covering an end portion the pixel electrode is formed, and an EL layer including a light-emitting layer is formed over an entire surface. Then, a metal mask is placed over the EL layer and film deposition is performed with the metal mask, whereby an island-shaped counter electrode (also referred to as an upper electrode) is formed. Then, the EL layer is processed using the counter electrode as a hard mask, whereby an island-shaped EL layer is formed. In this manner, since the EL layer is processed after being formed over the entire surface without utilizing a film deposition method using a metal mask, the island-shaped EL layer can be formed with a uniform thickness.

In another method for manufacturing a display apparatus of one embodiment of the present invention, an island-shaped pixel electrode is formed, an insulating layer covering an end portion of the pixel electrode is formed, and an EL layer including a light-emitting layer and a counter electrode are formed over an entire surface. Then, a metal mask is placed over the counter electrode, and the EL layer and the counter electrode are processed using the metal mask. Also by this method, the EL layer is processed after being formed over the entire surface without utilizing a film deposition method using a metal mask, whereby the island-shaped EL layer can be formed with a uniform thickness.

In either of the above-described two manufacturing methods, layers included in adjacent light-emitting devices overlap each other over the insulating layer. In view of this, in manufacture of the display apparatus of one embodiment of the present invention, after a plurality of light-emitting devices that emit light of different colors from each other from their respective light-emitting layers are formed, a resist mask is formed over the plurality of light-emitting devices. In addition, a plurality of EL layers and a plurality of counter electrodes overlapping each other over the insulating layer are removed using the resist mask, whereby part of the insulating layer is exposed. Thus, the adjacent light-emitting devices can be electrically insulated from each other over the insulating layer. Accordingly, light emission from a light-emitting device other than the desired light-emitting device by leakage of a current to the adjacent light-emitting device (also referred to as crosstalk) can be inhibited. In manufacture of a display apparatus of one embodiment of the present invention, the number of processes using a photolithography method can be reduced to one. Alternatively, a process using a photolithography method may be omitted. Thus, the manufacturing cost of the display apparatus can be reduced.

[Structure Example of Display Apparatus]

Figure 1B:
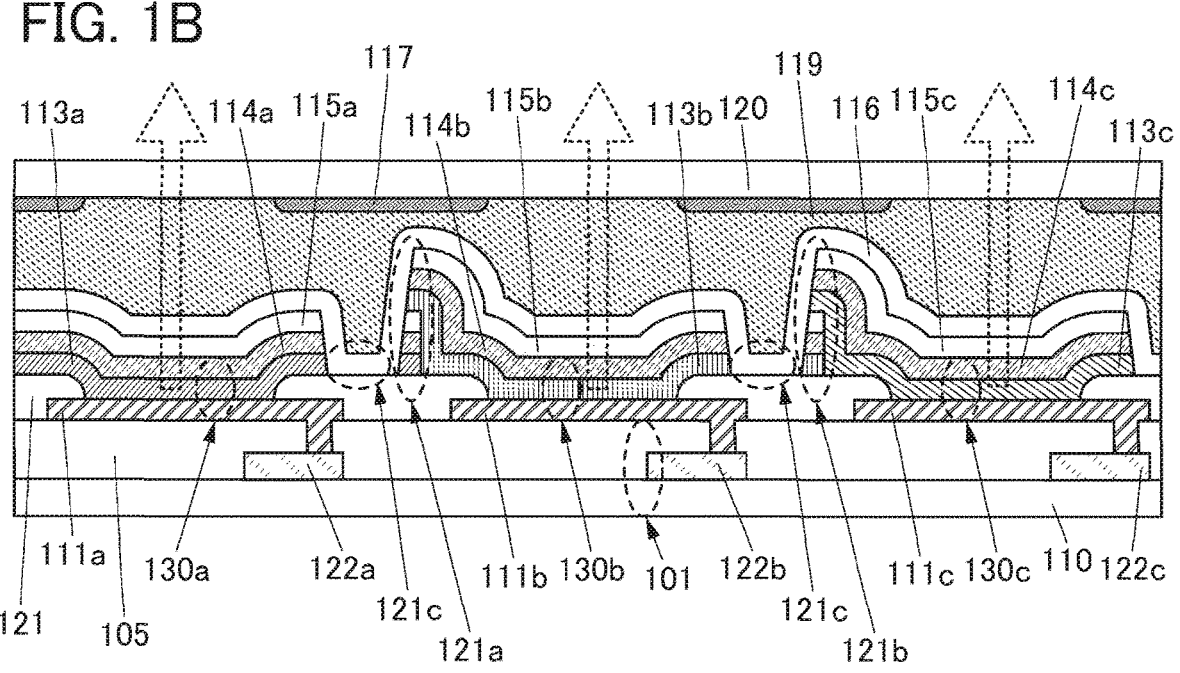

FIG. 1A and FIG. 1B illustrate a display apparatus of one embodiment of the present invention.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The display apparatus illustrated in FIG. 1A is of a bottom-emission structure, and the display apparatus illustrated in FIG. 1B is of a top-emission structure.

In each of the display apparatuses illustrated in FIG. 1A and FIG. 1B, transistors 122a, 122b, and 122c are provided over a substrate 110, an insulating layer 105 is provided to cover the transistors, light-emitting devices 130a, 130b, and 130c are provided over the insulating layer 105, and a protective layer 116 is provided to cover these light-emitting devices. A substrate 120 is bonded to the protective layer 116 with a resin layer 119. Note that the substrate 120 is provided with a light-blocking layer 117 in FIG. 1B.

The light-emitting devices 130a, 130b, and 130c emit light of different colors from each other. Preferably, the light-emitting devices 130a, 130b, and 130c emit light of three colors, red (R), green (G), and blue (B), for example.

The light-emitting device 130a includes a pixel electrode 111a over the insulating layer 105, an EL layer 113a over the pixel electrode 111a, and a counter electrode 114a over the EL layer 113a. The pixel electrode 111a is electrically connected to the transistor 122a.

The light-emitting device 130b includes a pixel electrode 111b over the insulating layer 105, an EL layer 113b over the pixel electrode 111b, and a counter electrode 114b over the EL layer 113b. The pixel electrode 111b is electrically connected to the transistor 122b.

The light-emitting device 130c includes a pixel electrode 111c over the insulating layer 105, an EL layer 113c over the pixel electrode 111c, and a counter electrode 114c over the EL layer 113c. The pixel electrode 111c is electrically connected to the transistor 122c.

A conductive film that transmits visible light is used as the electrode through which light is extracted among the pixel electrode and the counter electrode. A conductive film that reflects visible light is preferably used as the electrode through which light is not extracted. As a material that forms the pair of electrodes (the pixel electrode and the counter electrode) of the light-emitting device, a metal, an alloy, an electrically conductive compound, a mixture thereof, and the like can be used as appropriate. Specific examples include In—Sn oxide (also referred to as ITO), In—Si—Sn oxide (also referred to as ITSO), In—Zn oxide, In—W—Zn oxide, an alloy containing aluminum (an aluminum alloy) such as an alloy of aluminum, nickel, and lanthanum (Al—Ni-La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) and an alloy containing an appropriate combination of any of these metals. It is also possible to use an element belonging to Group 1 or Group 2 of the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

The light-emitting devices preferably employ a microcavity structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

Note that the semi-transmissive and semi-reflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The semi-transmissive and semi-reflective electrode has a visible light reflectance of higher than or equal to 10% and lower than or equal to 95%, preferably higher than or equal to 30% and lower than or equal to 80%. The reflective electrode has a visible light reflectance of higher than or equal to 40% and lower than or equal to 100%, preferably higher than or equal to 70% and lower than or equal to 100%. These electrodes preferably have a resistivity lower than or equal to $1\times10^{-2}$ Ωcm.

The EL layer includes at least a light-emitting layer. In addition to the light-emitting layer, the EL layer may further include a layer containing a substance with a high hole-injection property, a layer containing a substance with a high hole-transport property, a layer containing a hole-blocking material, a layer containing an electron-blocking material, a layer containing a substance with a high electron-transport property, a layer containing a substance with a high electron-injection property, a layer containing a substance with a bipolar property (a substance with a high electron- and hole-transport property), or the like. For example, the EL layer may include at least one of a hole-injection layer, a hole-transport layer, a hole-blocking layer, an electron-blocking layer, an electron-transport layer, and an electron-injection layer.

The light-emitting layer is a layer containing a light-emitting substance. Note that as the light-emitting substance, a substance that exhibits an emission color of blue, purple, bluish purple, green, yellowish green, yellow, orange, red, or the like is appropriately used. A substance that emits near-infrared light may be used. There is no particular limitation on the light-emitting substance that can be used for the light-emitting layer, and it is possible to use a light-emitting substance that converts singlet excitation energy into light in the visible light range or a light-emitting substance that converts triplet excitation energy into light in the visible light range. As an example of the light-emitting substance that converts singlet excitation energy into light, a substance that emits fluorescence (a fluorescent material) can be given. As examples of the light-emitting substance that converts triplet excitation energy into light, a substance that emits phosphorescence (phosphorescent material) and a thermally activated delayed fluorescence (TADF) material that exhibits thermally activated delayed fluorescence can be given. The light-emitting layer may contain one or more kinds of compounds (a host material, an assist material) in addition to the light-emitting substance (a guest material). As the host material and the assist material, one or more kinds of substances having a larger energy gap than the light-emitting substance (the guest material) can be selected and used. As the host material and the assist material, compounds which form an exciplex are preferably used in combination. In order to form an exciplex efficiently, it is particularly preferable to combine a compound that easily accepts holes (hole-transport material) and a compound that easily accepts electrons (electron-transport material).

Either a low molecular compound or a high molecular compound can be used for the light-emitting devices, and an inorganic compound (e.g., a quantum dot material) may also be included.

A protective layer 115a is preferably included over the light-emitting device 130a. Similarly, a protective layer 115b is preferably included over the light-emitting device 130b. Furthermore, a protective layer 115c is preferably included over the light-emitting device 130c.

The provided protective layers 115a, 115b, and 115c can inhibit the regions overlapping the protective layers of the EL layers and the counter electrodes from being damaged in the film processing step. As a result, the reliability of the light-emitting devices can be increased. There is no particular limitation on the conductivity of the protective layers 115a, 115b, and 115c. As the protective layers 115a, 115b, and 115c, at least one type of an insulating film, a semiconductor film, and a conductive film can be used.

Since the protective layers 115a, 115b, and 115c function as hard masks in manufacturing the display apparatus, the protective layers 115a, 115b, and 115c are preferably inorganic films. When the protective layers include inorganic films, oxidation of the counter electrodes and entry of impurities (e.g., moisture or oxygen) to the counter electrodes and the EL layers can be inhibited. Thus, the EL layers and the counter electrodes can be protected and the reliability of the light-emitting devices can be increased.

As the protective layers 115a, 115b, and 115c, one or more of an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film. Examples of the nitride oxide insulating film include a silicon nitride oxide film.

Note that in this specification and the like, oxynitride refers to a material that contains more oxygen than nitrogen, and nitride oxide refers to a material that contains more nitrogen than oxygen.

In particular, a silicon nitride film, a silicon nitride oxide film, and an aluminum oxide film are suitable for the protective layers 115a, 115b, and 115c because of their high moisture barrier properties.

As the protective layers 115a, 115b, and 115c, an inorganic film containing In—Sn oxide (also referred to as ITO), In—Zn oxide, Ga—Zn oxide, Al—Zn oxide, In—Ga—Zn oxide (also referred to as IGZO), or the like can also be used. The inorganic film preferably has high resistance, specifically, higher resistance than the counter electrodes 114a, 114b, and 114c. The inorganic film may further contain nitrogen.

In the case where light emitted by the light-emitting devices is extracted through the protective layers 115a, 115b, and 115c as in the display apparatus illustrated in FIG. 1B, the protective layers 115a, 115b, and 115c preferably have high transmittance with respect to visible light. For example, ITO, IGZO, and aluminum oxide are preferable because they are inorganic materials having high transmittance with respect to visible light.

As the protective layers 115a, 115b, and 115c, for example, a stacked-layer structure of an aluminum oxide film and a silicon nitride film over the aluminum oxide film, or a stack-layer structure of an aluminum oxide film and an IGZO film over the aluminum oxide film can be used. Such a stacked-layer structure can suppress entry of impurities (e.g., water and oxygen) into the EL layers.

Furthermore, adjusting the thicknesses of the protective layers 115a, 115b, and 115c can improve light extraction efficiency of the light-emitting devices.

Materials that can be used for the protective layer 116 are similar to the materials that can be used for the protective layers 115a, 115b, and 115c. Furthermore, the protective layer 116 may include an organic film. For example, the protective layer 116 may include both an organic film and an inorganic film. The provided protective layer 116 can inhibit deterioration of the light-emitting devices and improve the reliability of the display apparatus.

End portions of the pixel electrodes 111a, 111b, and 111c are covered with an insulating layer 121. The insulating layer 121 includes a region 121a overlapping the EL layer 113a, the counter electrode 114a, the EL layer 113b, and the counter electrode 114b, a region 121b overlapping the EL layer 113b, the counter electrode 114b, and the EL layer 113c, and the counter electrode 114c, and a region 121c in contact with the protective layer 116. The region 121a may further include the protective layer 115a and the protective layer 115b. The region 121b may further include the protective layer 115b and the protective layer 115c.

In the light-emitting apparatus of this embodiment, the light-emitting devices are provided with the island-shaped light-emitting layers of their respective colors, and the light-emitting apparatus is manufactured by what is called a separate coloring method. Thus, the light-emitting apparatus can have higher light extraction efficiency compared with a structure in which a white-light-emitting device and color filters are combined. Furthermore, since a light-emitting device with a single structure can be used, the driving voltage of the light-emitting apparatus can be lower than that of a light-emitting apparatus having a structure using a tandem light-emitting device.

[Display Apparatus Manufacturing Method Example 1]

Next, an example of a method for manufacturing a display apparatus is described with reference to FIG. 2 to FIG. 5.

Thin films that form the display apparatus (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

The thin films that form the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

For manufacture of the light-emitting devices, a vacuum process such as an evaporation method or a solution process such as a spin coating method or an ink-jet method can be especially used. As the evaporation method, a physical vapor deposition method (PVD method) such as a sputtering method, an ion plating method, an ion beam evaporation method, a molecular beam evaporation method, or a vacuum evaporation method, a chemical vapor deposition method (CVD method), and the like can be given. Specifically, the functional layers (e.g., the hole-injection layer, the hole-transport layer, the light-emitting layer, the electron-transport layer, and the electron-injection layer) included in the EL layers can be formed by an evaporation method (e.g., a vacuum evaporation method), a coating method (e.g., a dip coating method, a die coating method, a bar coating method, a spin coating method, or a spray coating method), a printing method (e.g., an ink-jet method, screen printing (stencil), offset printing (planography), flexography (relief printing), gravure printing, or micro-contact printing), or the like.

When the thin films that form the semiconductor device are processed, a photolithography method or the like can be used for the processing. Alternatively, a nanoimprinting method, a sandblasting method, a lift-off method, or the like may be used for the processing of the thin films. Island-shaped thin films may be directly formed by a deposition method using a blocking mask such as a metal mask.

There are the following two typical examples of a photolithography method. In one of the methods, a resist mask is formed over a thin film that is to be processed, the thin film is processed by etching or the like, and the resist mask is removed. In the other method, after a photosensitive thin film is formed, light exposure and development are performed, so that the thin film is processed into a desired shape.

As the light used for light exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Light exposure may be performed by liquid immersion light exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because extremely minute processing can be performed. Note that in the case of performing light exposure by scanning of a beam such as an electron beam, a photomask is not needed.

For etching of the thin film, a dry etching method, a wet etching method, a sandblasting method, or the like can be used.

Figure 2A:
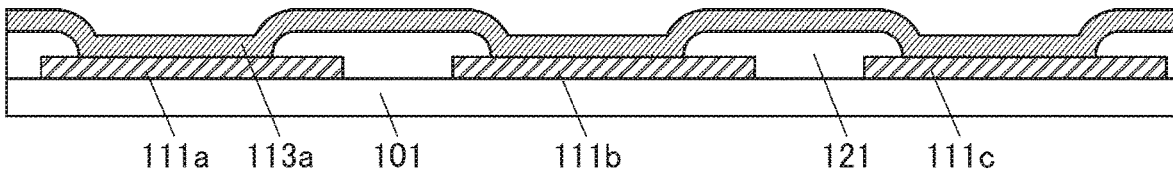
FIG. 2A to FIG. 2D are cross-sectional views illustrating an example of a method for manufacturing a display apparatus.

As illustrated in FIG. 2A, the pixel electrodes 111a, 111b, and 111c are formed over a layer 101 including transistors. Next, the insulating layer 121 that covers the end portions of the pixel electrodes 111a, 111b, and 111c is formed. Then, the EL layer 113a is formed over the pixel electrodes 111a, 111b, and 111c and the insulating layer 121.

The layer 101 including transistors corresponds to, for example, the stacked-layer structure of the substrate 110, the transistors 122a, 122b, and 122c, and the insulating layer 105 illustrated in FIG. 1A and FIG. 1B.

Materials that can be used for the pixel electrodes are as described above. For formation of the pixel electrodes, a sputtering method or a vacuum evaporation method can be used, for example.

The insulating layer 121 can have a single-layer structure or a stacked-layer structure including one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layers 115a, 115b, and 115c can be used.

When an inorganic insulating film is used as the insulating layer 121 that covers the end portions of the pixel electrodes, impurities are less likely to enter the light-emitting devices as compared with the case where an organic insulating film is used; therefore, the reliability of the light-emitting devices can be improved. When an organic insulating film is used as the insulating layer 121 that covers the end portions of the pixel electrodes, high step coverage can be obtained as compared with the case where an inorganic insulating film is used; therefore, an influence of the shape of the pixel electrodes can be small. Therefore, a short circuit in the light-emitting devices can be prevented.

The structure that can be used for the EL layer 113a is as described above. The layers that form the EL layer 113a can each be formed by a method such as an evaporation method (including a vacuum evaporation method), a transfer method, a printing method, an inkjet method, or a coating method. The layers that form the EL layer 113a may be formed using a premix material.

Figure 2B:
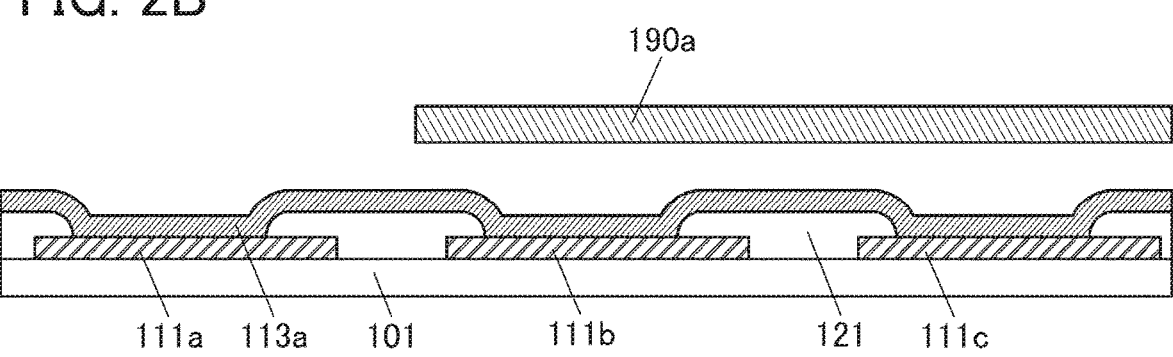

Next, as illustrated in FIG. 2B, a metal mask 190a is placed over the EL layer 113a. The metal mask 190a includes an opening at a position overlapping the pixel electrode 111a. The metal mask 190a overlaps each of the pixel electrode 111b and the pixel electrode 111c.

Figure 2C:
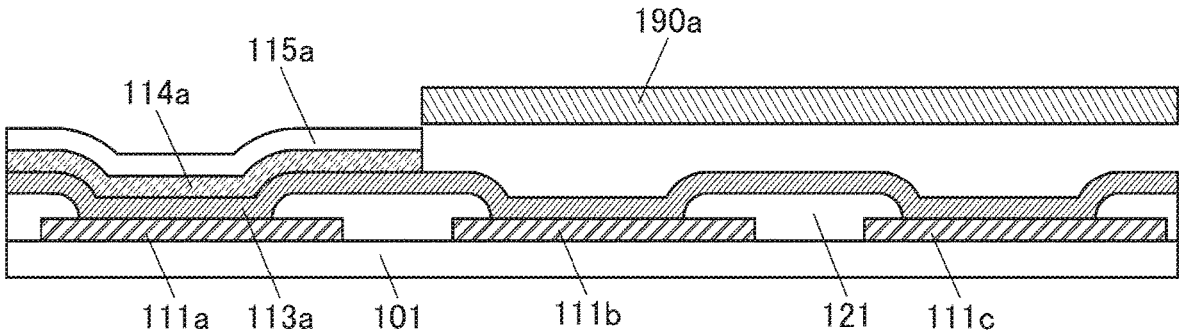

Then, as illustrated in FIG. 2C, the counter electrode 114a is formed over the EL layer 113a through the opening of the metal mask 190a. Since the metal mask 190a includes the opening at a position overlapping the pixel electrode 111a, the counter electrode 114a is formed at a position overlapping the pixel electrode 111a with the EL layer 113a therebetween. Note that the counter electrode 114a may also be formed at a position overlapping the pixel electrode 111b or the pixel electrode 111c with the insulating layer 121 and the EL layer 113a therebetween, while it is not preferable that the counter electrode 114a be formed at a position overlapping the pixel electrode 111b or the pixel electrode 111c without the insulating layer 121 therebetween.

Furthermore, the protective layer 115a is preferably formed over the counter electrode 114a with the metal mask 190a.

Materials that can be used for the counter electrode 114a are as described above. For formation of the counter electrode 114a, a sputtering method or a vacuum evaporation method can be used, for example.

Materials that can be used for the protective layer 115a are as described above. At least one of a metal oxide layer containing indium, gallium, zinc, and oxygen and a metal oxide layer containing indium, tin, and oxygen is preferably deposited as the protective layer 115a.

Examples of methods for forming the protective layer 115a include a vacuum evaporation method, a sputtering method, a CVD method, and an ALD method. As the protective layer 115a, two or more films formed by different deposition methods may be stacked.

Figure 2D:
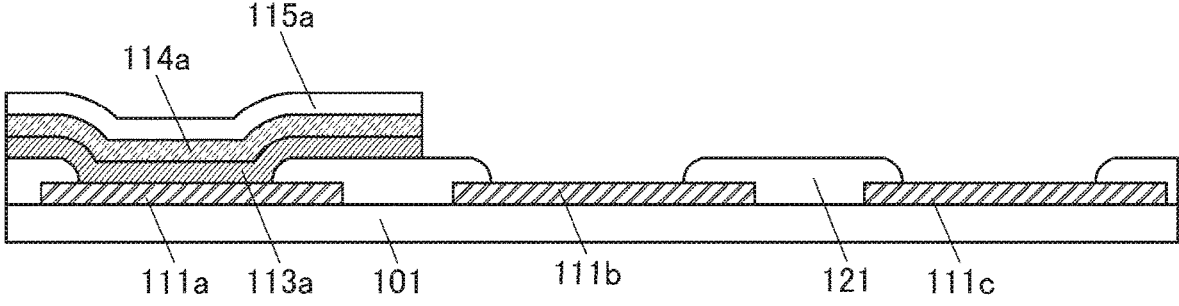

Next, as illustrated in FIG. 2D, at least part of a region overlapping the pixel electrode 111b and at least part of a region overlapping the pixel electrode 111c of the EL layer 113a are removed using the counter electrode 114a and the protective layer 115a as hard masks. In this step, a region not overlapping the counter electrode 114a and the protective layer 115a of the EL layer 113a can be removed as illustrated in FIG. 2D. In the above-described manner, the EL layer 113a can be formed in an island shape.

The EL layer 113a is preferably processed by anisotropic etching. Anisotropic dry etching is particularly preferable. As an etching gas, a gas containing nitrogen, a gas containing hydrogen, a gas containing nitrogen and hydrogen, or the like is preferably used. Deterioration of the EL layer 113a can be inhibited by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the EL layer 113a can be suppressed. Furthermore, a defect such as attachment of a reaction product generated at the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a noble gas (also referred to as rare gas) such as He or Ar as the etching gas, for example. Alternatively, a gas containing oxygen and at least one of the above are preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas. As another example, a gas containing $H_2$ and Ar and a gas containing oxygen can be used as the etching gas.

The provided protective layer 115a can inhibit the region overlapping the protective layer 115a of the EL layer 113a and the counter electrode 114a from being damaged in the processing step of the EL layer 113a. As a result, the reliability of the light-emitting device can be increased.

Note that it is preferable to select the material of the protective layer 115a and the processing method of the EL layer 113a so that the protective layer 115a is not processed at the time of processing the EL layer 113a.

Next, as illustrated in FIG. 3A, the EL layer 113b is formed over the protective layer 115a, the pixel electrodes 111b and 111c, and the insulating layer 121.

The EL layer 113b emits light of a color different from that of light emitted by the EL layer 113a. Structures, materials, and the like that can be used for the EL layer 113b are similar to those of the EL layer 113a. The EL layer 113b can be formed by a method similar to that used for the EL layer 113a.

Next, as illustrated in FIG. 3B, a metal mask 190b is placed over the EL layer 113b. The metal mask 190b includes an opening at a position overlapping the pixel electrode 111b. The metal mask 190b overlaps each of the pixel electrode 111a and the pixel electrode 111c.

Then, as illustrated in FIG. 3C, the counter electrode 114b is formed over the EL layer 113b through the opening of the metal mask 190b. Since the metal mask 190b includes the opening at a position overlapping the pixel electrode 111b, the counter electrode 114b is formed at a position overlapping the pixel electrode 111b with the EL layer 113b therebetween. Note that the counter electrode 114b may also be formed at a position overlapping the pixel electrode 111a or the pixel electrode 111c with the insulating layer 121 and the EL layer 113b therebetween, while it is not preferable that the counter electrode 114b be formed at a position overlapping the pixel electrode 111a or the pixel electrode 111c without the insulating layer 121 therebetween.

Furthermore, the protective layer 115b is preferably formed over the counter electrode 114b with the metal mask 190b.

Materials that can be used for the counter electrode 114b are similar to those for the counter electrode 114a. The counter electrode 114b can be formed by a method similar to that used for the counter electrode 114a.

Materials that can be used for the protective layer 115b are similar to those for the protective layer 115a. The protective layer 115b can be formed by a method similar to that used for the protective layer 115a.

Next, as illustrated in FIG. 3D, at least part of a region overlapping the pixel electrode 111a and at least part of a region overlapping the pixel electrode 111c of the EL layer 113b are removed using the counter electrode 114b and the protective layer 115b as hard masks. In this step, a region not overlapping the counter electrode 114b and the protective layer 115b of the EL layer 113b can be removed as illustrated in FIG. 3D. In the above-described manner, the EL layer 113b can be formed in an island shape.

The EL layer 113b can be processed by a method similar to that used for the EL layer 113a.

Here, the protective layer 115a is provided over the EL layer 113a and the counter electrode 114a, whereby the EL layer 113*a* and the counter electrode 114*a* can be inhibited from being damaged at the time of processing the EL layer 113*b*. As a result, the reliability of the light-emitting device can be increased.

Note that it is preferable to select the materials of the protective layer 115*a* and the protective layer 115*b* and the processing method of the EL layer 113*b* so that the protective layer 115*a* and the protective layer 115*b* are not processed at the time of processing the EL layer 113*b*.

Figure 4A:
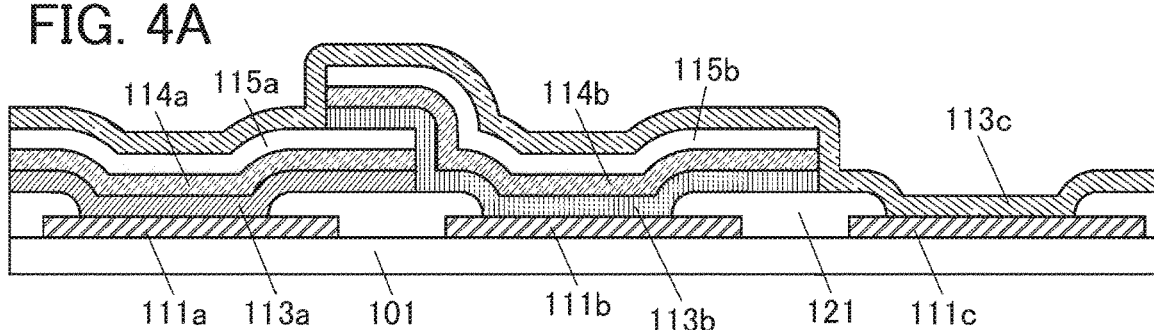
FIG. 4A to FIG. 4D are cross-sectional views illustrating the example of the method for manufacturing the display apparatus.

Next, as illustrated in FIG. 4A, the EL layer 113*c* is formed over the protective layers 115*a* and 115*b*, the pixel electrode 111*c*, and the insulating layer 121.

The EL layer 113*c* emits light of a color different from those of light emitted by the EL layer 113*a* and the EL layer 113*b*. Structures, materials, and the like that can be used for the EL layer 113*c* are similar to those of the EL layer 113*a*.

Figure 4B:
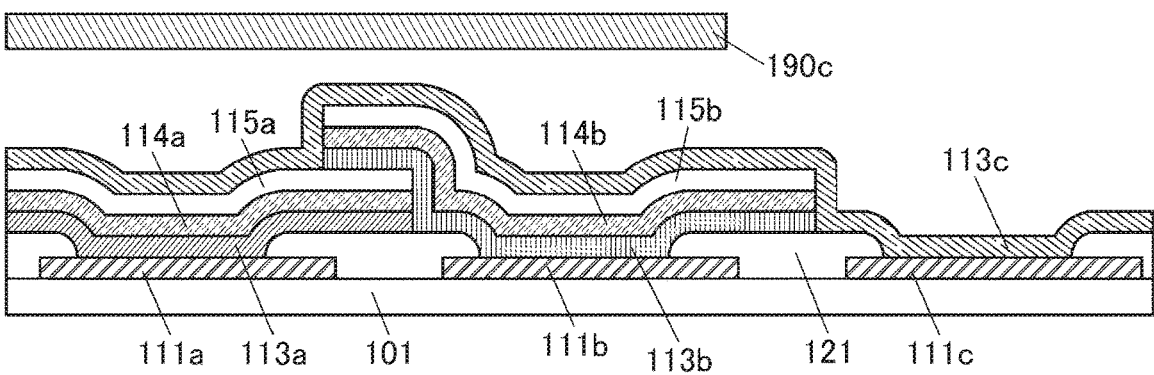

Next, as illustrated in FIG. 4B, a metal mask 190*c* is placed over the EL layer 113*c*. The metal mask 190*c* includes an opening at a position overlapping the pixel electrode 111*c*. The metal mask 190*c* overlaps each of the pixel electrode 111*a* and the pixel electrode 111*b*.

Figure 4C:
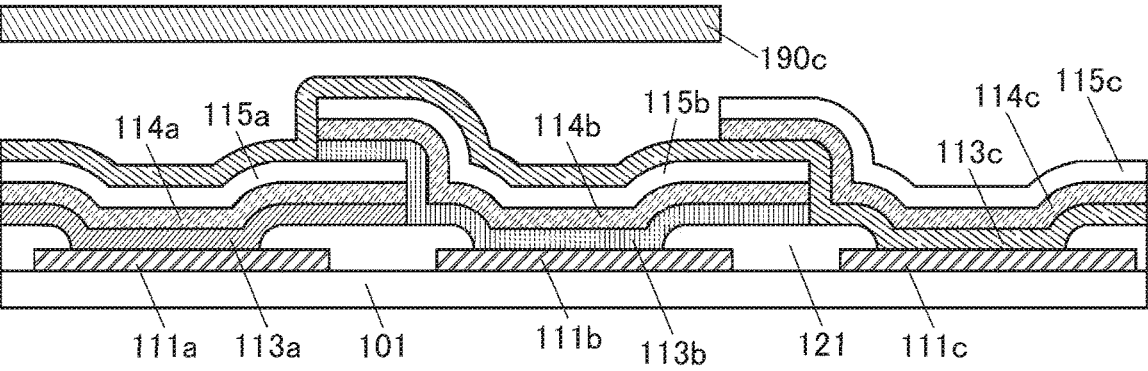

Then, as illustrated in FIG. 4C, the counter electrode 114*c* is formed over the EL layer 113*c* through the opening of the metal mask 190*c*. Since the metal mask 190*c* includes the opening at a position overlapping the pixel electrode 111*c*, the counter electrode 114*c* is formed at a position overlapping the pixel electrode 111*c* with the EL layer 113*c* therebetween. Note that the counter electrode 114*c* may also be formed at a position overlapping the pixel electrode 111*a* or the pixel electrode 111*b* with the insulating layer 121 and the EL layer 113*c* therebetween, while it is not preferable that the counter electrode 114*c* be formed at a position overlapping the pixel electrode 111*a* or the pixel electrode 111*b* without the insulating layer 121 therebetween.

Furthermore, the protective layer 115*c* is preferably formed over the counter electrode 114*c* with the metal mask 190*c*.

Materials that can be used for the EL layer 113*c* are similar to those of the EL layer 113*a*. The EL layer 113*c* can be formed by a method similar to that used for the EL layer 113*a*.

Materials that can be used for the counter electrode 114*c* are similar to those for the counter electrode 114*a*. The counter electrode 114*c* can be formed by a method similar to that used for the counter electrode 114*a*.

Materials that can be used for the protective layer 115*c* are similar to those for the protective layer 115*a*. The protective layer 115*c* can be formed by a method similar to that used for the protective layer 115*a*.

Figure 4D:
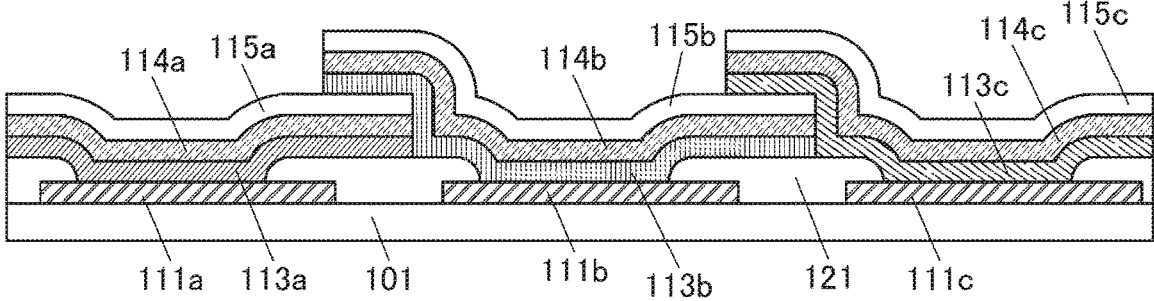

Next, as illustrated in FIG. 4D, at least part of a region overlapping the pixel electrode 111*a* and at least part of a region overlapping the pixel electrode 111*b* of the EL layer 113*c* are removed using the counter electrode 114*c* and the protective layer 115*c* as hard masks. In this step, a region not overlapping the counter electrode 114*c* and the protective layer 115*c* of the EL layer 113*c* can be removed as illustrated in FIG. 4D. In the above-described manner, the EL layer 113*c* can be formed in an island shape.

The EL layer 113*c* can be processed by a method similar to that used for the EL layer 113*a*.

Here, the protective layer 115*a* is provided over the EL layer 113*a* and the counter electrode 114*a*, whereby the EL layer 113*a* and the counter electrode 114*a* can be inhibited from being damaged at the time of processing the EL layer 113*c*. Similarly, the protective layer 115*b* is provided over the EL layer 113*b* and the counter electrode 114*b*, whereby the EL layer 113*b* and the counter electrode 114*b* can be inhibited from being damaged at the time of processing the EL layer 113*c*.

Note that it is preferable to select the materials of the protective layers 115*a*, 115*b*, and 115*c* and the processing method of the EL layer 113*c* so that the protective layers 115*a*, 115*b*, and 115*c* are not processed at the time of processing the EL layer 113*c*.

Note that in the case of manufacturing a bottom-emission display apparatus or the like, at least one of the EL layer 113*c*, the counter electrode 114*c*, and the protective layer 115*c* may be provided over the light-emitting device 130*a* and the light-emitting device 130*b* in some cases. For example, after the EL layer 113*c* is formed, the counter electrode 114*c* and the protective layer 115*c* may be formed without the metal mask 190*c* placed. Alternatively, removal of part of the EL layer 113*c* using the counter electrode 114*c* and the protective layer 115*c* as the hard masks may be omitted. In other words, a step illustrated in FIG. 5A may be performed next to the step illustrated in FIG. 4C.

In the case where the EL layer 113*c* remains over the entire surface as illustrated in FIG. 4C, the protective layers 115*a* and 115*b* that are in contact with the EL layer 113*c* are preferably each an insulating film. Furthermore, the counter electrode 114*c* may be formed with the metal mask 190*c*, and the protective layer 115*c* may be formed over the entire surface without using the metal mask 190*c*. Thus, deterioration of each of the light-emitting devices can be inhibited by using the protective layer 115*c*, and the reliability can be increased.

Figure 5A:
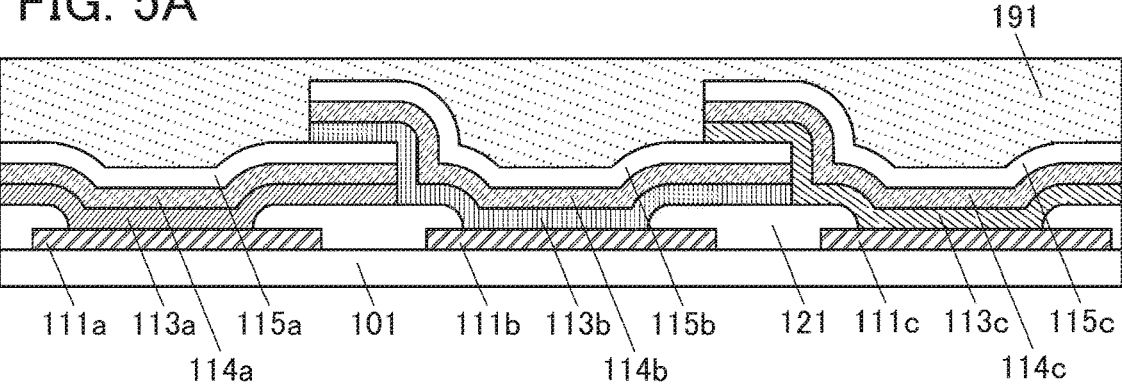
FIG. 5A to FIG. 5D are cross-sectional views illustrating the example of the method for manufacturing the display apparatus.

Next, as illustrated in FIG. 5A, a resist film 191 is formed by application of a photosensitive resin (photoresist) over the protective layers 115*a*, 115*b*, and 115*c*.

Before the resist film 191 is formed, a protective film may further be formed over the protective layers 115*a*, 115*b*, and 115*c*. A material that can be used for the protective layer is similar to the materials for the protective layers 115*a*, 115*b*, and 115*c*. The formation of the protective layer over the entire surface so as to cover the protective layers 115*a*, 115*b*, and 115*c* can inhibit deterioration of each of the light-emitting devices and thus increase the reliability.

Figure 5B:
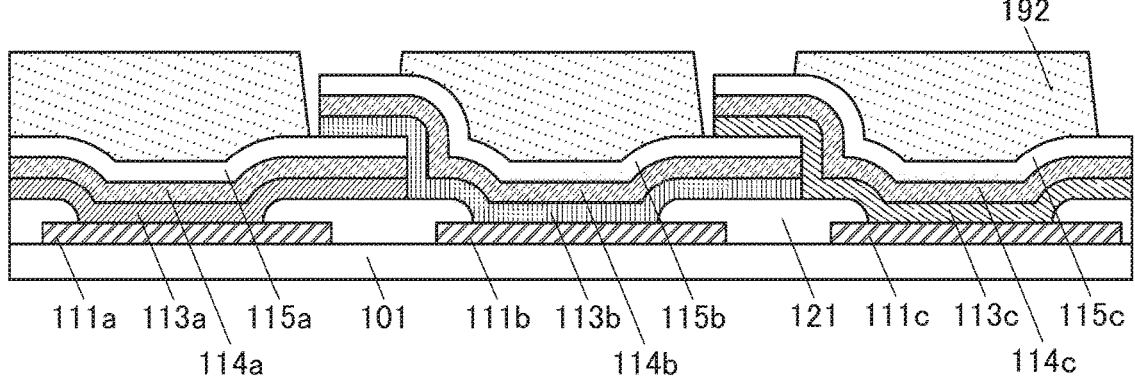

Then, a resist mask 192 illustrated in FIG. 5B is formed through light exposure and development. The resist mask 192 includes an opening at a position overlapping the insulating layer 121. Alternatively, the resist mask 192 includes a plurality of island-shaped regions each overlapping one or more of the pixel electrodes, and a region where the resist mask 192 is not provided exists over the insulating layer 121.

Next, at least part of a region overlapping the insulating layer 121 of at least one of the EL layers 113*a*, 113*b*, and 113*c*, the counter electrodes 114*a*, 114*b*, and 114*c*, and the protective layers 115*a*, 115*b*, and 115*c* is removed using the resist mask 192, whereby part of the insulating layer 121 is exposed.

Figure 5C:
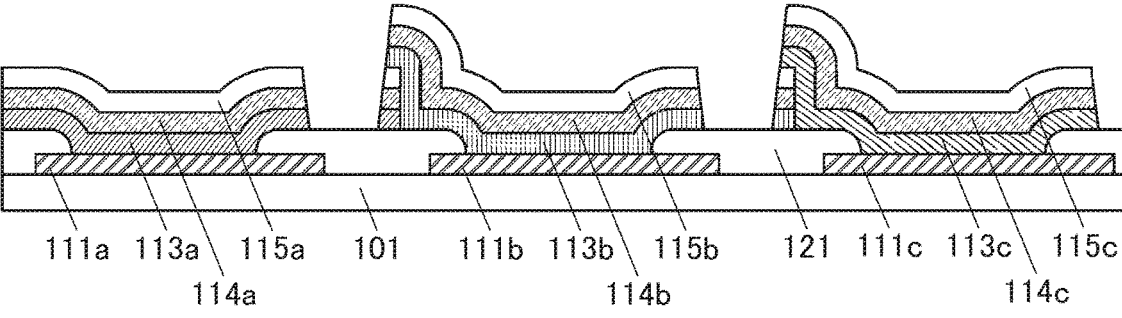

FIG. 5C illustrates an example in which part of a portion where the EL layers 113*a* and 113*b*, the counter electrodes 114*a* and 114*b*, and the protective layers 115*a* and 115*b* are stacked and part of a portion where the EL layers 113*b* and 113*c*, the counter electrodes 114*b* and 114*c*, and the protective layers 115*b* and 115*c* are stacked over the insulating layer 121 are mainly removed.

In FIG. 5B, an end portion of the EL layer 113*a* is in contact with the EL layer 113*b*, and an end portion of the EL layer 113*b* is in contact with the EL layer 113*c*. Thus, a current might leak to an adjacent light-emitting device and a light-emitting device other than the desired light-emitting device might emit light in the case where a highly conductive layer is included in the EL layers, for example. Therefore, as illustrated in FIG. 5C, the adjacent light-emitting devices are preferably electrically insulated from each other over the insulating layer 121.

Figure 5D:
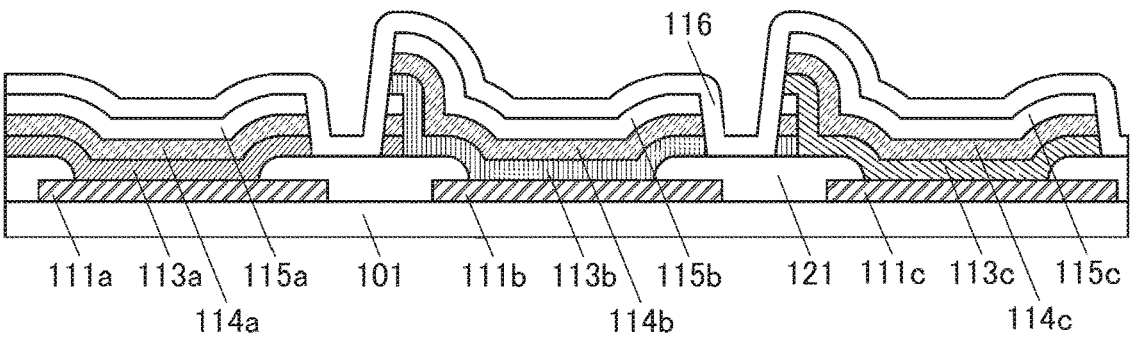

Then, as illustrated in FIG. 5D, the protective layer 116 is formed over the protective layers 115a, 115b, and 115c and the insulating layer 121. The protective layer 116 is provided in contact with a side surface of a stacked-layer structure in which the EL layer 113a, the counter electrode 114a, the protective layer 115a, the EL layer 113b, the counter electrode 114b, and the protective layer 115b are stacked in this order. In addition, the protective layer 116 is provided in contact with a side surface of a stacked-layer structure in which the EL layer 113b, the counter electrode 114b, the protective layer 115b, the EL layer 113c, the counter electrode 114c, and the protective layer 115c are stacked in this order.

Materials that can be used for the protective layer 116 are as described above.

In the above-described manner, since the EL layer is processed after being formed over the entire surface without utilizing a film deposition method using a metal mask in the display apparatus manufacturing method example 1, the island-shaped EL layer can be formed with a uniform thickness. Moreover, the number of processes using a photolithography method can be reduced to one. Alternatively, a process using a photolithography method may be omitted. Thus, the manufacturing cost of the display apparatus can be reduced.

The EL layers 113a, 113b, and 113c forming the light-emitting devices of different colors are formed by different processes from each other. Accordingly, the respective EL layers can be formed to have structures (a material, thickness, and the like) appropriate for the light-emitting devices of different colors. Thus, the light-emitting devices can have favorable characteristics.

Figure 6A:
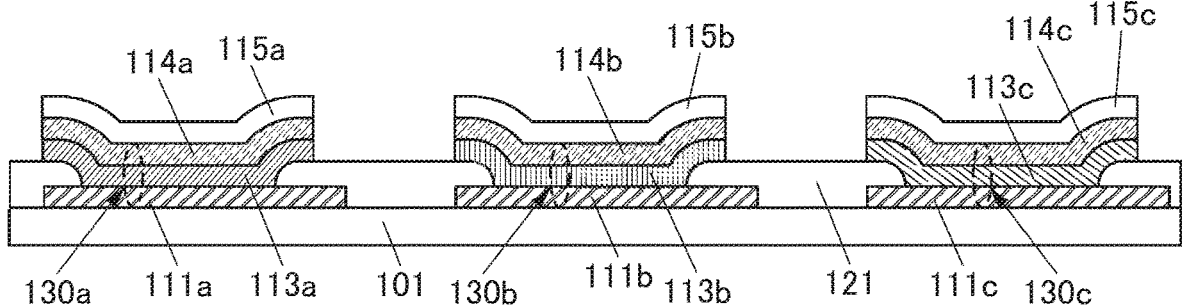
FIG. 6A to FIG. 6C are cross-sectional views illustrating an example of the method for manufacturing the display unit.

At a stage illustrated in FIG. 4D, the layers forming the light-emitting device 130a and the layers forming the light-emitting device 130b do not overlap each other in some cases, as illustrated in FIG. 6A. In FIG. 6A, the layers forming the light-emitting device 130b and the layers forming the light-emitting device 130c also do not overlap each other. In this case, the process using a photolithography method illustrated in FIG. 5A to FIG. 5C can be omitted.

Figure 6B:
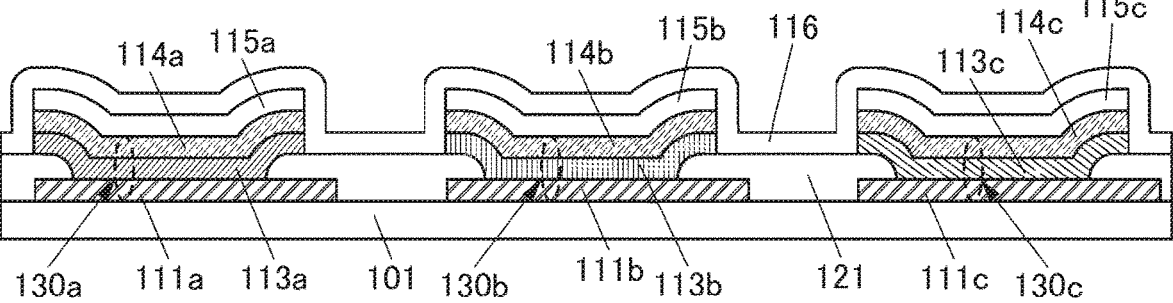
Figure 6C:
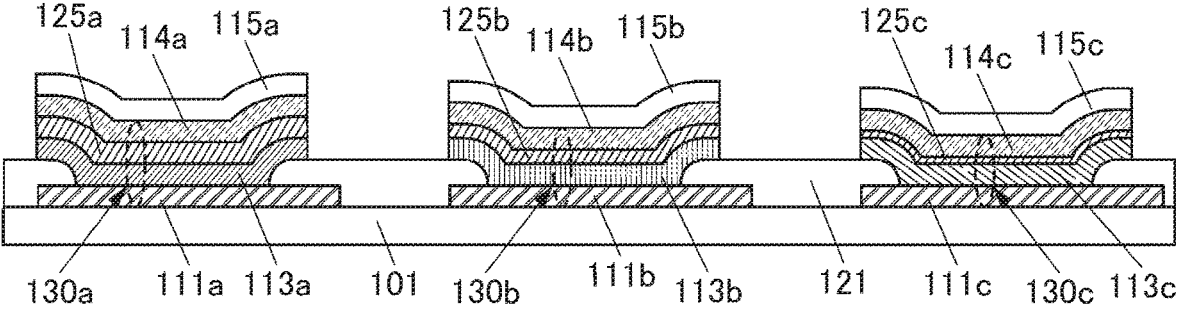

Alternatively, by performing the process using a photolithography method (i.e., at the stage of FIG. 5C), the structure illustrated in FIG. 6A can be obtained in some cases. In the case where the structure illustrated in FIG. 6A is formed, next, the protective layer 116 is formed over the protective layers 115a, 115b, and 115c and the insulating layer 121 as illustrated in FIG. 6B.

Each of the light-emitting devices may include a protective layer between the EL layer and the counter electrode. The light-emitting device 130a illustrated in FIG. 6C includes a protective layer 125a between the EL layer 113a and the counter electrode 114a. Similarly, the light-emitting device 130b illustrated in FIG. 6C includes a protective layer 125b between the EL layer 113b and the counter electrode 114b, and the light-emitting device 130c includes a protective layer 125c between the EL layer 113c and the counter electrode 114c.

The protective layers 125a, 125b, and 125c preferably function as part of the EL layers or part of the electrodes. Accordingly, the protective layers 125a, 125b, and 125c are preferably formed using materials that can be used for the EL layers or the electrodes. Furthermore, the protective layers 125a, 125b, and 125c preferably have high transmittance with respect to visible light.

The protective layers 125a, 125b, and 125c may have a function of an optical adjustment layer. The protective layers 125a, 125b, and 125c may have different thicknesses from each other. When the thicknesses of the protective layers 125a, 125b, and 125c are different, light of a specific color can be intensified and extracted from each of the light-emitting devices. Specifically, the thickness of the protective layer 125a is preferably adjusted so that the optical distance between the pair of electrodes in the light-emitting device 130a can become an optical distance that intensifies light of a color emitted by the EL layer 113a. Similarly, the thickness of the protective layer 125b is preferably adjusted so that the optical distance between the pair of electrodes in the light-emitting device 130b can become an optical distance that intensifies light of a color emitted by the EL layer 113b. The thickness of the protective layer 125c is preferably adjusted so that the optical distance between the pair of electrodes in the light-emitting device 130c can become an optical distance that intensifies light of a color emitted by the EL layer 113c.

[Display Apparatus Manufacturing Method Example 2]

Next, an example of a method for manufacturing a display apparatus different from the above is described with reference to FIG. 7 to FIG. 9. Note that description of portions similar to those in the manufacturing method example 1 is partly omitted.

Figure 7A:
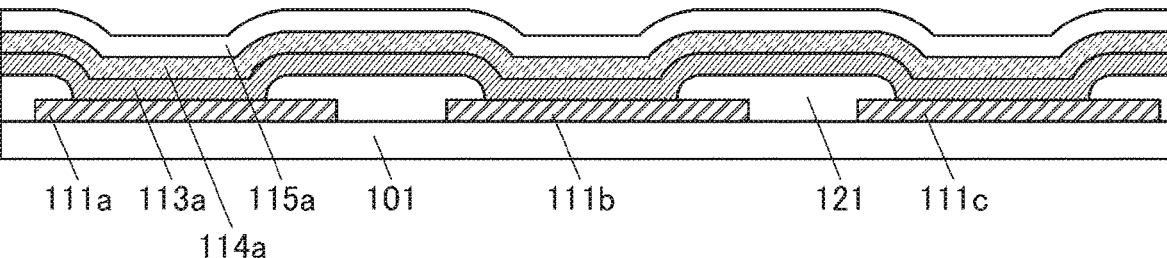
FIG. 7A to FIG. 7D are cross-sectional views illustrating an example of a method for manufacturing a display apparatus.

As illustrated in FIG. 7A, the pixel electrodes 111a, 111b, and 111c are formed over the layer 101 including transistors. Next, the insulating layer 121 that covers the end portions of the pixel electrodes 111a, 111b, and 111c is formed. Next, the EL layer 113a is formed over the pixel electrodes 111a, 111b, and 111c and the insulating layer 121. Next, the counter electrode 114a is formed over the EL layer 113a. Furthermore, the protective layer 115a is preferably formed over the counter electrode 114a.

Materials and formation methods of each of the layers are similar to those in the manufacturing method example 1.

Figure 7B:
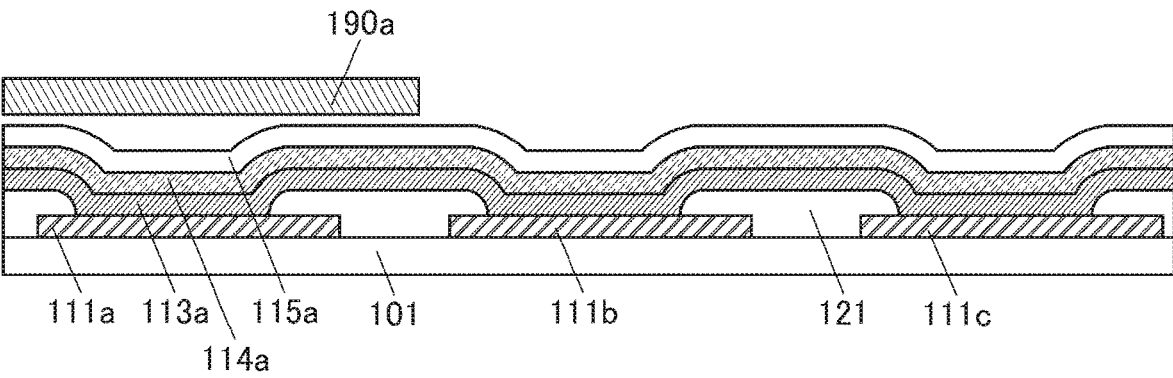

Next, as illustrated in FIG. 7B, the metal mask 190a is placed over the protective layer 115a. The metal mask 190a includes an opening at a position overlapping the pixel electrode 111b and the pixel electrode 111c. The metal mask 190a overlaps the pixel electrode 111a.

Figure 7C:
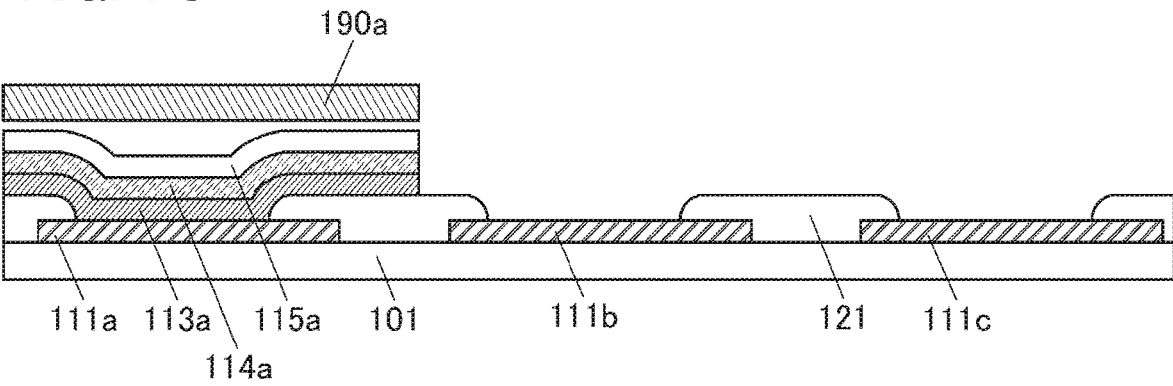
Figure 7D:
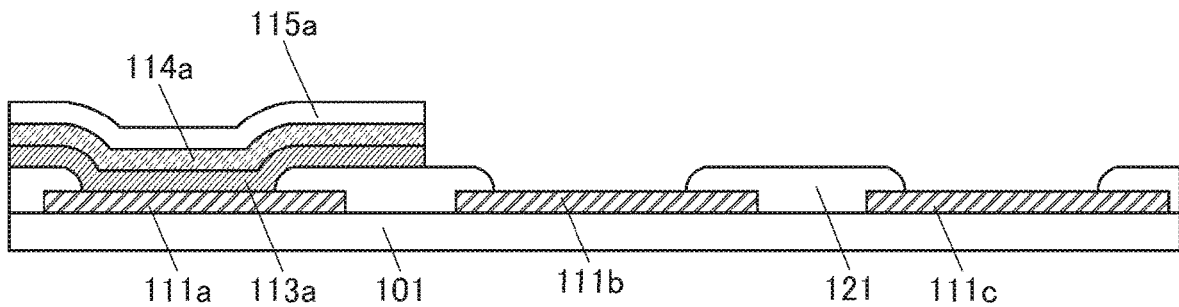

Then, as illustrated in FIG. 7C, at least part of a region overlapping the pixel electrode 111b and at least part of a region overlapping the pixel electrode 111c of the EL layer 113a, the counter electrode 114a, and the protective layer 115a are removed using the metal mask 190a. In this step, a region not overlapping the metal mask 190a of the EL layer 113a, the counter electrode 114a, and the protective layer 115a can be removed as illustrated in FIG. 7C. In the above-described manner, the EL layer 113a, the counter electrode 114a, and the protective layer 115a can be formed in an island shape so as to overlap the pixel electrode 111a (FIG. 7D).

In the EL layer 113a, the counter electrode 114a, and the protective layer 115a, at least a region overlapping the pixel electrode 111b without the insulating layer 121 therebetween and a region overlapping the pixel electrode 111c without the insulating layer 121 therebetween are removed. The region overlapping the pixel electrode 111b or the pixel electrode 111c with the insulating layer 121 therebetween of the EL layer 113a, the counter electrode 114a, and the protective layer 115a may be left without being removed.

The EL layer 113a can be processed using a method similar to that in the manufacturing method example 1.

The counter electrode 114*a* is preferably processed by anisotropic etching. Anisotropic dry etching is particularly preferable. Deterioration of the EL layer 113*a* can be inhibited by not using a gas containing oxygen as the etching gas in processing the counter electrode 114*a*. Alternatively, wet etching may be used.

The protective layer 115*a* is preferably processed by anisotropic etching. Anisotropic dry etching is particularly preferable. Alternatively, wet etching may be used.

Note that the processing of these three layers is preferably performed successively without exposure to the air in order to inhibit deterioration of the light-emitting devices. Accordingly, a method that can perform successive processing without exposure to the air using one apparatus is preferably selected.

Figure 8A:
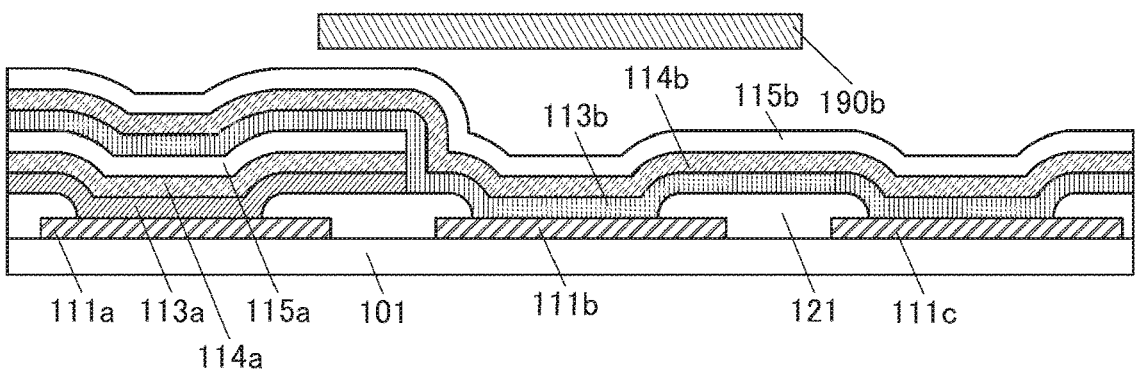

Next, as illustrated in FIG. 8A, the EL layer 113*b* is formed over the protective layer 115*a*, the pixel electrodes 111*b* and 111*c*, and the insulating layer 121. Next, the counter electrode 114*b* is formed over the EL layer 113*b*. Furthermore, the protective layer 115*b* is preferably formed over the counter electrode 114*b*.

The EL layer 113*b* can be formed by a method similar to that used for the EL layer 113*a*.

The counter electrode 114*b* can be formed by a method similar to that used for the counter electrode 114*a*.

The protective layer 115*b* can be formed by a method similar to that used for the protective layer 115*a*.

Figure 8B:
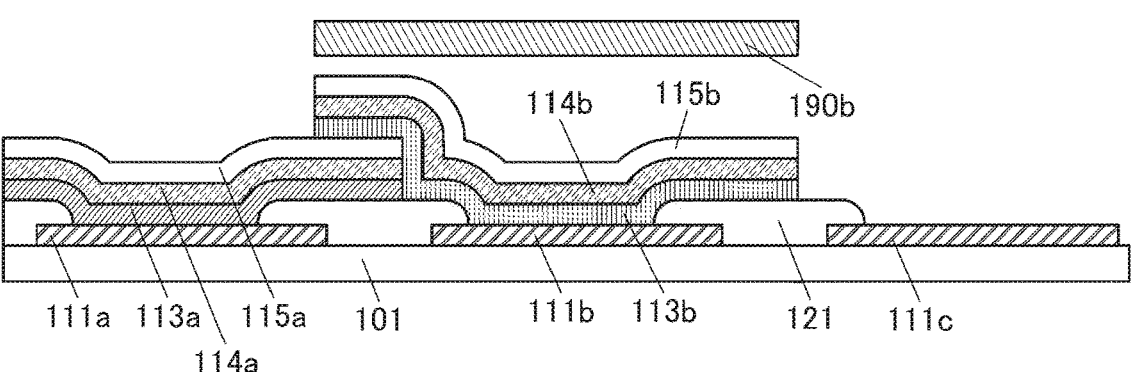

Next, as illustrated in FIG. 8B, the metal mask 190*b* is placed over the protective layer 115*b*. The metal mask 190*b* includes openings at positions overlapping the pixel electrode 111*a* and the pixel electrode 111*c*. The metal mask 190*b* overlaps the pixel electrode 111*b*.

Figure 8C:
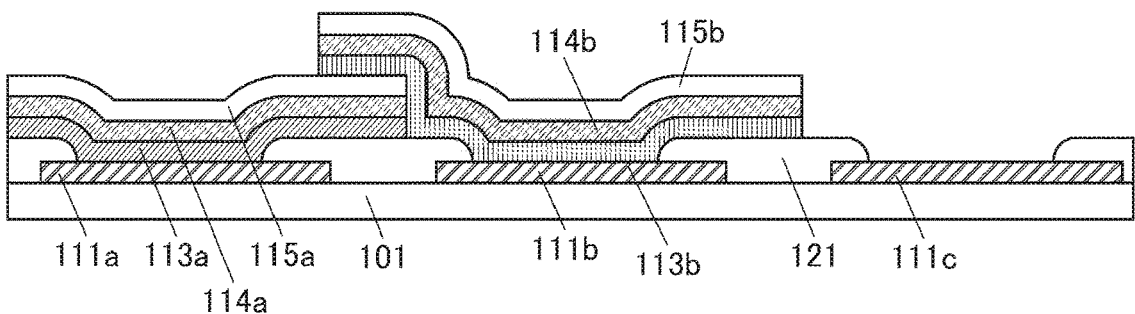

Then, as illustrated in FIG. 8C, at least part of a region overlapping the pixel electrode 111*a* and at least part of a region overlapping the pixel electrode 111*c* of the EL layer 113*b*, the counter electrode 114*b*, and the protective layer 115*b* are removed using the metal mask 190*b*. In this step, a region not overlapping the metal mask 190*b* of the EL layer 113*b*, the counter electrode 114*b*, and the protective layer 115*b* can be removed as illustrated in FIG. 8C. In the above-described manner, the EL layer 113*b*, the counter electrode 114*b*, and the protective layer 115*b* can be formed in an island shape so as to overlap the pixel electrode 111*b* (FIG. 8D).

The EL layer 113*b*, the counter electrode 114*b*, and the protective layer 115*b* can be processed by methods similar to those used for the EL layer 113*a*, the counter electrode 114*a*, and the protective layer 115*a*, respectively.

In the EL layer 113*b*, the counter electrode 114*b*, and the protective layer 115*b*, at least a region overlapping the pixel electrode 111*a* without the insulating layer 121 therebetween and a region overlapping the pixel electrode 111*c* without the insulating layer 121 therebetween are removed. The region overlapping the pixel electrode 111*a* or the pixel electrode 111*c* with the insulating layer 121 therebetween of the EL layer 113*b*, the counter electrode 114*b*, and the protective layer 115*b* may be left without being removed.

Here, the protective layer 115*a* is provided over the EL layer 113*a* and the counter electrode 114*a*, whereby the EL layer 113*a* and the counter electrode 114*a* can be inhibited from being damaged at the time of processing the EL layer 113*b* or the like. As a result, the reliability of the light-emitting device can be increased.

Note that it is preferable to select the material of the protective layer 115*a* and the processing method of the EL layer 113*b* so that the protective layer 115*a* is not processed at the time of processing the EL layer 113*b*.

Figure 9A:
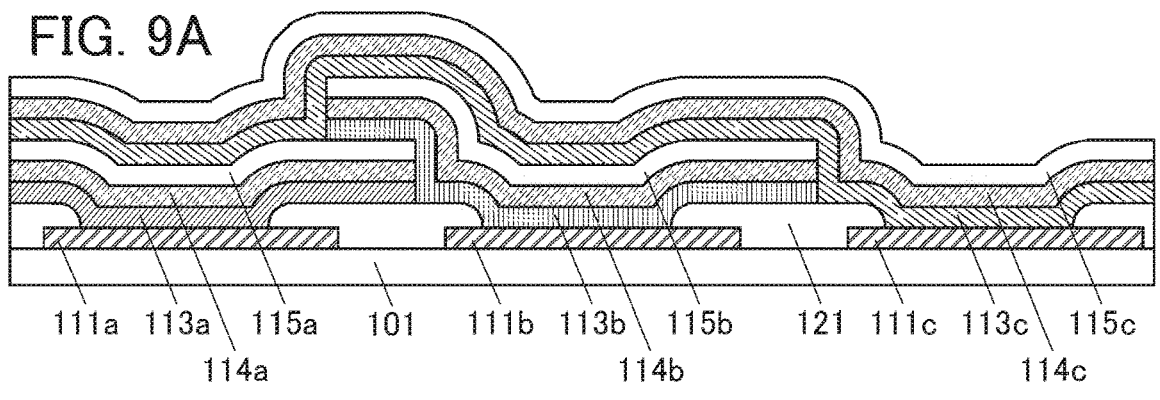
FIG. 9A to FIG. 9D are cross-sectional views illustrating the example of the method for manufacturing the display apparatus.

Next, as illustrated in FIG. 9A, the EL layer 113*c* is formed over the protective layers 115*a* and 115*b*, the pixel electrode 111*c*, and the insulating layer 121. Next, the counter electrode 114*c* is formed over the EL layer 113*c*. Furthermore, the protective layer 115*c* is preferably formed over the counter electrode 114*c*.

The EL layer 113*c* can be formed by a method similar to that used for the EL layer 113*a*.

The counter electrode 114*c* can be formed by a method similar to that used for the counter electrode 114*a*.

The protective layer 115*c* can be formed by a method similar to that used for the protective layer 115*a*.

Figure 9B:
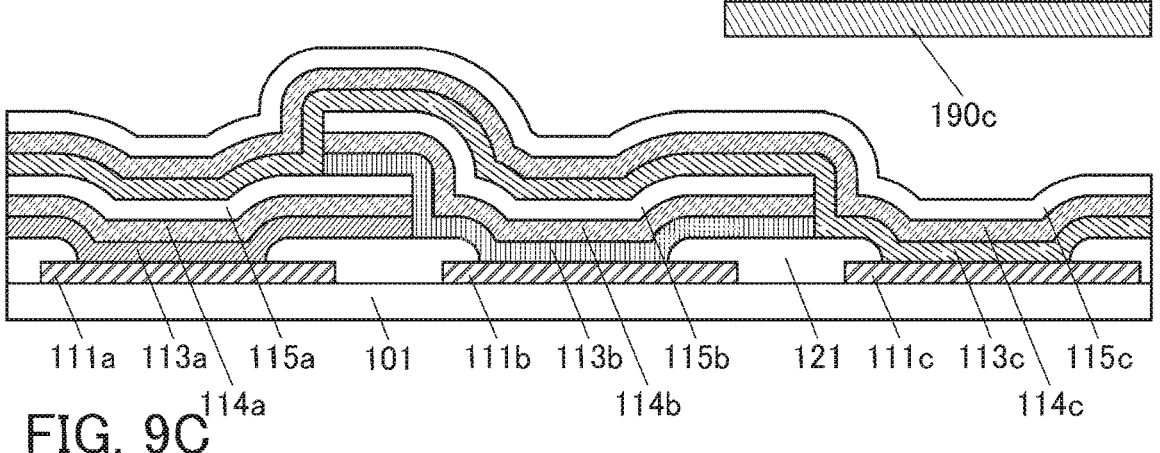

Next, as illustrated in FIG. 9B, the metal mask 190*c* is placed over the protective layer 115*c*. The metal mask 190*c* includes an opening at a position overlapping the pixel electrode 111*a* and the pixel electrode 111*b*. The metal mask 190*c* overlaps the pixel electrode 111*c*.

Figure 9C:
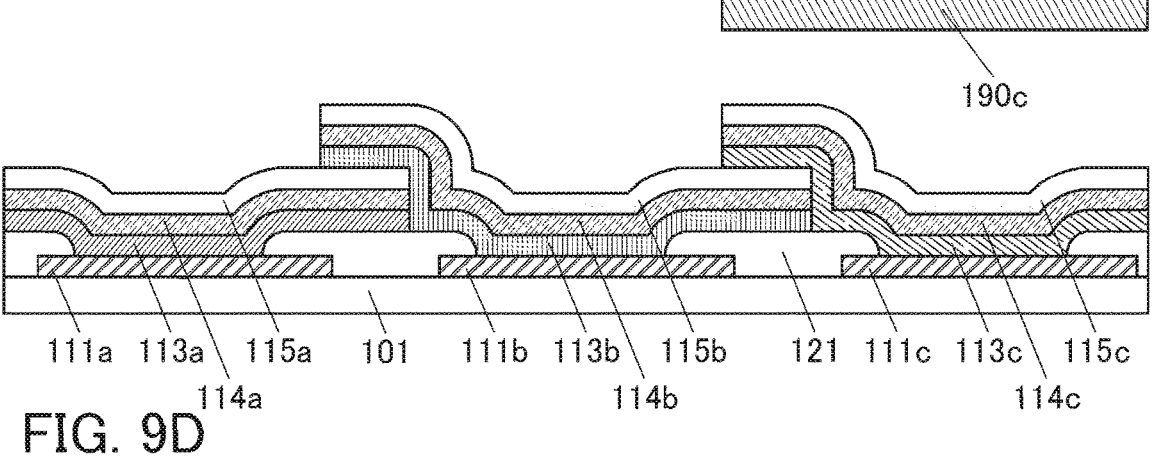
Figure 9D:
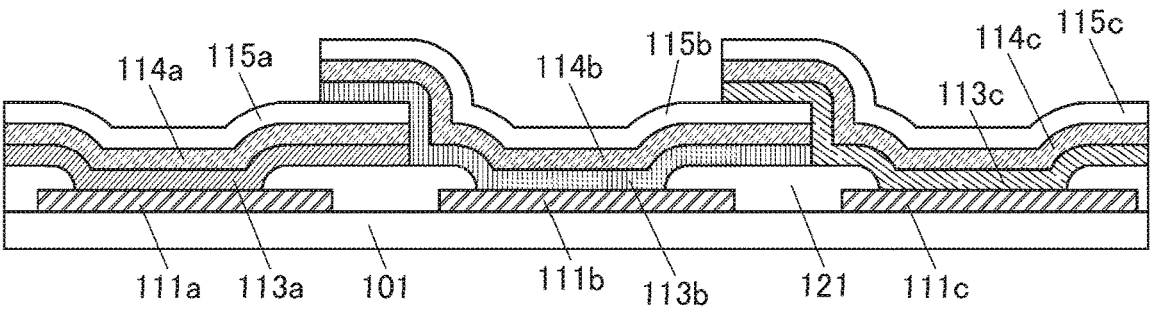

Then, as illustrated in FIG. 9C, at least part of a region overlapping the pixel electrode 111*a* and at least part of a region overlapping the pixel electrode 111*b* of the EL layer 113*c*, the counter electrode 114*c*, and the protective layer 115*c* are removed using the metal mask 190*c*. In this step, a region not overlapping the metal mask 190*c* of the EL layer 113*c*, the counter electrode 114*c*, and the protective layer 115*c* can be removed as illustrated in FIG. 9C. In the above-described manner, the EL layer 113*c*, the counter electrode 114*c*, and the protective layer 115*c* can be formed in an island shape so as to overlap the pixel electrode 111*c* (FIG. 9D).

The EL layer 113*c*, the counter electrode 114*c*, and the protective layer 115*c* can be processed by methods similar to those used for the EL layer 113*a*, the counter electrode 114*a*, and the protective layer 115*a*, respectively.

In the EL layer 113*c*, the counter electrode 114*c*, and the protective layer 115*c*, at least a region overlapping the pixel electrode 111*a* without the insulating layer 121 therebetween and a region overlapping the pixel electrode 111*b* without the insulating layer 121 therebetween are removed. The region overlapping the pixel electrode 111*a* or the pixel electrode 111*b* with the insulating layer 121 therebetween of the EL layer 113*c*, the counter electrode 114*c*, and the protective layer 115*c* may be left without being removed.

Here, the protective layer 115*a* is provided over the EL layer 113*a* and the counter electrode 114*a*, whereby the EL layer 113*a* and the counter electrode 114*a* can be inhibited from being damaged at the time of processing the EL layer 113*c* or the like. Similarly, the protective layer 115*b* is provided over the EL layer 113*b* and the counter electrode 114*b*, whereby the EL layer 113*b* and the counter electrode 114*b* can be inhibited from being damaged at the time of processing the EL layer 113*c* or the like.

Note that it is preferable to select the materials of the protective layer 115*a* and the protective layer 115*b* and the processing method of the EL layer 113*c* so that the protective layer 115*a* and the protective layer 115*b* are not processed at the time of processing the EL layer 113*c*. The stacked-layer structure illustrated in FIG. 9D is similar to the stacked-layer structure illustrated in FIG. 4D. Accordingly, after this step, the above-described steps illustrated in FIG. to FIG. 5D can be sequentially performed. For these steps, the above description can be referred to.

At a stage illustrated in FIG. 9D, the layers forming the light-emitting device 130*a* and the layers forming the light-emitting device 130*b* do not overlap each other in some cases, as illustrated in FIG. 6A. In FIG. 6A, the layers forming the light-emitting device 130*b* and the layers forming the light-emitting device 130*c* also do not overlap each other. In this case, the process using a photolithography method illustrated in FIG. 5A to FIG. 5C can be omitted.

Alternatively, by performing the process using a photolithography method (i.e., at the stage of FIG. 5C), the structure illustrated in FIG. 6A can be obtained in some cases.

In the case where the structure illustrated in FIG. 6A is formed, next, the protective layer 116 is formed over the protective layers 115a, 115b, and 115c and the insulating layer 121 as illustrated in FIG. 6B.

Note that in the case of manufacturing a bottom-emission display apparatus or the like, at least one of the EL layer 113c, the counter electrode 114c, and the protective layer 115c may be provided over the light-emitting device 130a and the light-emitting device 130b in some cases. That is, after the protective layer 115c is formed as illustrated in FIG. 9A, the process using a photolithography method illustrated from FIG. 5A may be performed.

In the above-described manner, since the EL layer is processed after being formed over the entire surface without utilizing a film deposition method using a metal mask in the display apparatus manufacturing method example 2, the island-shaped EL layer can be formed with a uniform thickness. Moreover, the number of processes using a photolithography method can be reduced to one. Alternatively, a process using a photolithography method may be omitted. Thus, the manufacturing cost of the display apparatus can be reduced.

The EL layers 113a, 113b, and 113c forming the light-emitting devices of different colors are formed by different processes from each other. Accordingly, the respective EL layers can be formed to have structures (a material, thickness, and the like) appropriate for the light-emitting devices of different colors. Thus, the light-emitting devices can have favorable characteristics.

Since the display apparatus of this embodiment can be manufactured by a method in which formation of EL layers using a metal mask is not performed and the number of processes using a photolithography method is reduced, an increase in size, definition, or resolution of the display apparatus can be achieved.

This embodiment can be combined with the other embodiments as appropriate. In the case where a plurality of structure examples are described in one embodiment in this specification, the structure examples can be combined as appropriate.

Embodiment 2

In this embodiment, a display apparatus of one embodiment of the present invention is described with reference to FIG. 10 to FIG. 12.

The display apparatus in this embodiment can be a high-definition display apparatus or large-sized display apparatus. Accordingly, the display apparatus of this embodiment can be used for display portions of electronic apparatuses such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Apparatus 100A]

Figure 10:
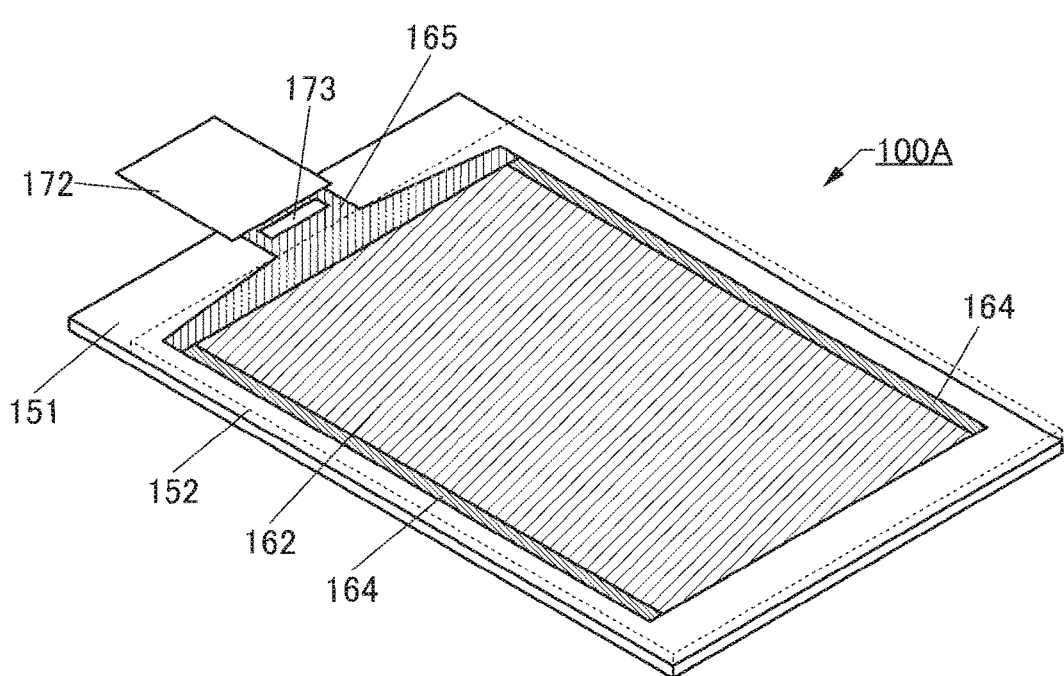
FIG. 10 is a perspective view illustrating an example of a display apparatus.
Figures 11A, 11B:
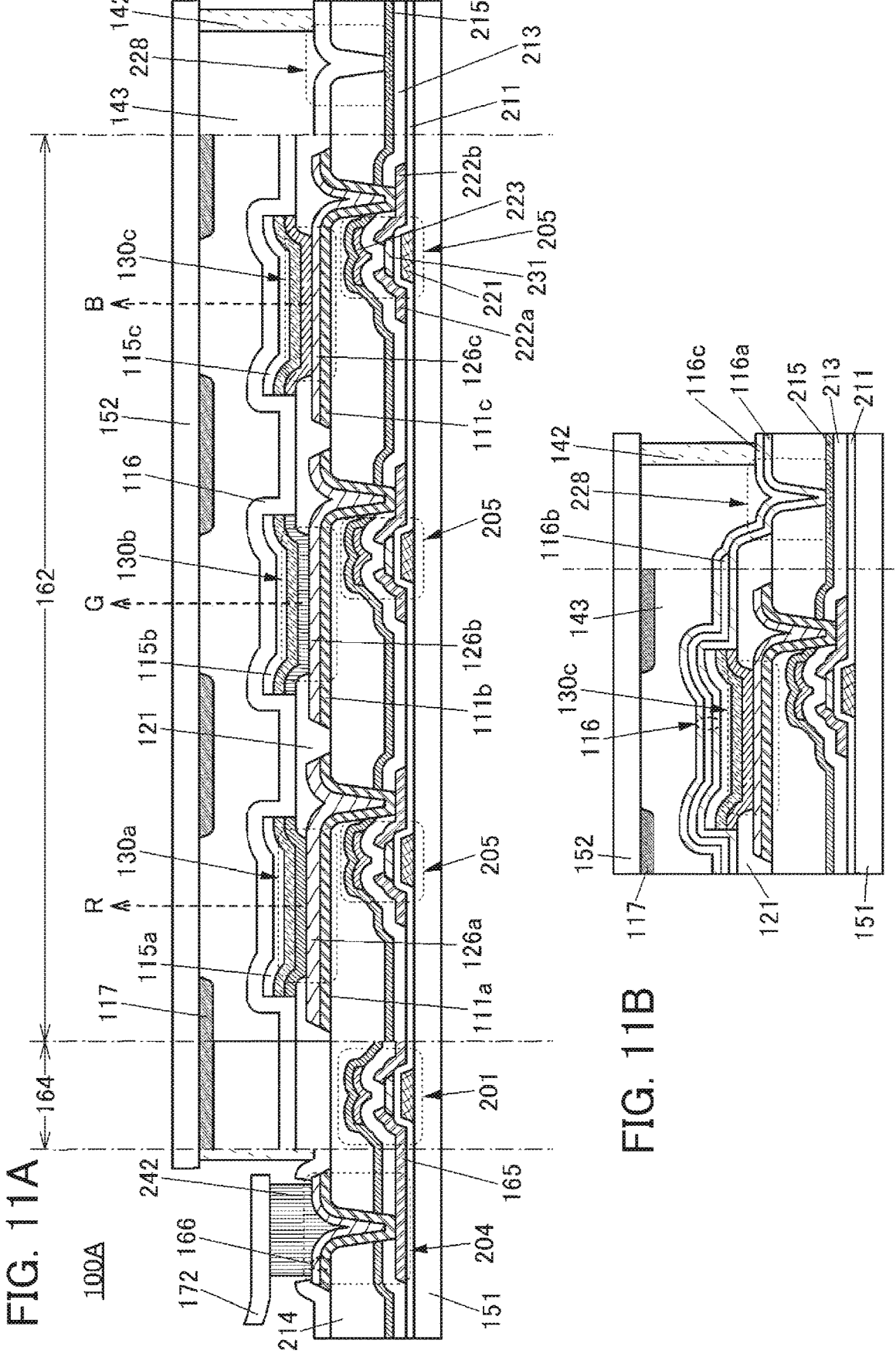
FIG. 11A and FIG. 11B are cross-sectional views illustrating an example of a display apparatus.

FIG. 10 is a perspective view of a display apparatus 100A, and FIG. 11A is a cross-sectional view of the display apparatus 100A.

The display apparatus 100A has a structure where a substrate 152 and a substrate 151 are bonded to each other. In FIG. 10, the substrate 152 is denoted by a dashed line.

The display apparatus 100A includes a display portion 162, a circuit 164, a wiring 165, and the like. FIG. 10 illustrates an example in which an IC 173 and an FPC 172 are mounted on the display apparatus 100A. Thus, the structure illustrated in FIG. 10 can be regarded as a display module including the display apparatus 100A, the IC (integrated circuit), and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or input to the wiring 165 from the IC 173.

FIG. 10 illustrates an example in which the IC 173 is provided over the substrate 151 by a COG (Chip on Glass) method, a COF (Chip on Film) method, or the like. An IC including a scan line driver circuit, a signal line driver circuit, or the like can be used as the IC 173, for example. Note that the display apparatuses 100A and the display module are not necessarily provided with an IC. The IC may be mounted on the FPC by a COF method or the like.

FIG. 11A illustrates an example of cross sections of part of a region including the FPC 172, part of the circuit 164, part of the display portion 162, and part of a region including an end portion of the display apparatus 100A.

The display apparatus 100A illustrated in FIG. 11A includes a transistor 201, a transistor 205, a light-emitting device 130a which emits red light, a light-emitting device 130b which emits green light, a light-emitting device 130c which emits blue light, and the like between the substrate 151 and the substrate 152.

In the case where a pixel of the display apparatus includes three kinds of subpixels including light-emitting devices emitting different colors from each other, the three subpixels can be of three colors of R, G, and B or of three colors of yellow (Y), cyan (C), and magenta (M). In the case where four subpixels are included, the four subpixels can be of four colors of R, G, B, and white (W) or of four colors of R, G, B, and Y.

The protective layer 116 and the substrate 152 are bonded to each other with an adhesive layer 142. A solid sealing structure, a hollow sealing structure, or the like can be employed to seal the light-emitting devices. In FIG. 11A, a hollow sealing structure is employed in which a space 143 surrounded by the substrate 152, the adhesive layer 142, and the substrate 151 is filled with an inert gas (e.g., nitrogen or argon). The adhesive layer 142 may be provided to overlap with the light-emitting device. The space 143 surrounded by the substrate 152, the adhesive layer 142, and the substrate 151 may be filled with a resin different from that of the adhesive layer 142.

The light-emitting devices 130a, 130b, and 130c each have the same structure as the stacked-layer structure illustrated in FIG. 6A except that they have an optical adjustment layer between the pixel electrode and the EL layer. The light-emitting device 130a includes an optical adjustment layer 126a, the light-emitting device 130b includes an optical adjustment layer 126b, and the light-emitting device 130c includes an optical adjustment layer 126c. Embodiment 1 can be referred to for the details of the light-emitting devices. The protective layers 115a, 115b, and 115c are provided over the light-emitting devices 130a, 130b, and 130c, respectively.

The pixel electrodes 111a, 111b, and 111c are each electrically connected to a conductive layer 222b included in the transistor 205 through an opening provided in an insulating layer 214.

End portions of the pixel electrode and the optical adjustment layer are covered with the insulating layer 121. The pixel electrode contains a material that reflects visible light, and the counter electrode contains a material that transmits visible light.

Light from the light-emitting device is emitted toward the substrate 152. For the substrate 152, a material having a high visible-light-transmitting property is preferably used.

The transistor 201 and the transistor 205 are formed over the substrate 151. These transistors can be fabricated using the same material in the same step.

An insulating layer 211, an insulating layer 213, an insulating layer 215, and an insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of a display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned on the inner side compared to the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 11A, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100A can be increased.

Each of the transistors 201 and 205 includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. Either of a top-gate transistor structure and a bottom-gate transistor structure can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a semiconductor having crystallinity, in which case deterioration of the transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display apparatus of this embodiment. Alternatively, a semiconductor layer of a transistor may contain silicon. Examples of silicon include amorphous silicon and crystalline silicon (e.g., low-temperature poly silicon or single crystal silicon).

The semiconductor layer preferably contains indium, M (M is one or more selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more selected from aluminum, gallium, yttrium, and tin.

It is particularly preferable that an oxide containing indium (In), gallium (Ga), and zinc (Zn) (also referred to as IGZO) be used as the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

Note that when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with In being 1.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the pixel electrode and a conductive film obtained by processing the same conductive film as the optical adjustment layer. On a top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

When the protective layer 116 covering the light-emitting device is provided, which prevents an impurity such as water from entering the light-emitting device. As a result, the reliability of the light-emitting device can be enhanced.

In the region 228 in the vicinity of the end portion of the display apparatus 100A, the insulating layer 215 and the protective layer 116 are preferably in contact with each other through an opening in the insulating layer 214. In particular, the inorganic insulating film included in the insulating layer 215 and the inorganic insulating film included in the protective layer 116 are preferably in contact with each other. This can inhibit entry of impurities into the display portion 162 from the outside through the organic insulating film. Consequently, the reliability of the display apparatus 100A can be enhanced.

FIG. 11B illustrates an example in which the protective layer 116 has a three-layer structure. In FIG. 11B, the protective layer 116 includes an inorganic insulating layer 116a over the light-emitting device 130c, an organic insulating layer 116b over the inorganic insulating layer 116a, and an inorganic insulating layer 116c over the organic insulating layer 116b.

An end portion of the inorganic insulating layer 116a and an end portion of the inorganic insulating layer 116c extend beyond an end portion of the organic insulating layer 116b and are in contact with each other. The inorganic insulating layer 116a is in contact with the insulating layer 215 (inorganic insulating layer) at the opening in the insulating layer 214 (organic insulating layer). Accordingly, the light-emitting device can be surrounded by the insulating layer 215 and the protective layer 116, whereby the reliability of the light-emitting device can be increased.

As described above, the protective layer 116 may have a stacked-layer structure of an organic insulating film and an inorganic insulating film. In that case, end portions of the inorganic insulating layers preferably extend beyond an end portion of the organic insulating layer.

For each of the substrates 151 and 152, glass, quartz, ceramics, sapphire, a resin, a metal, an alloy, a semiconductor, or the like can be used. The substrate on the side from which light from the light-emitting device is extracted is formed using a material which transmits the light. When the substrates 151 and 152 are formed using a flexible material, the flexibility of the display apparatus can be increased. Furthermore, a polarizing plate may be used as the substrate 151 or the substrate 152.

For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting device.

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

[Display Apparatus 100B]

Figures 12A, 12B:
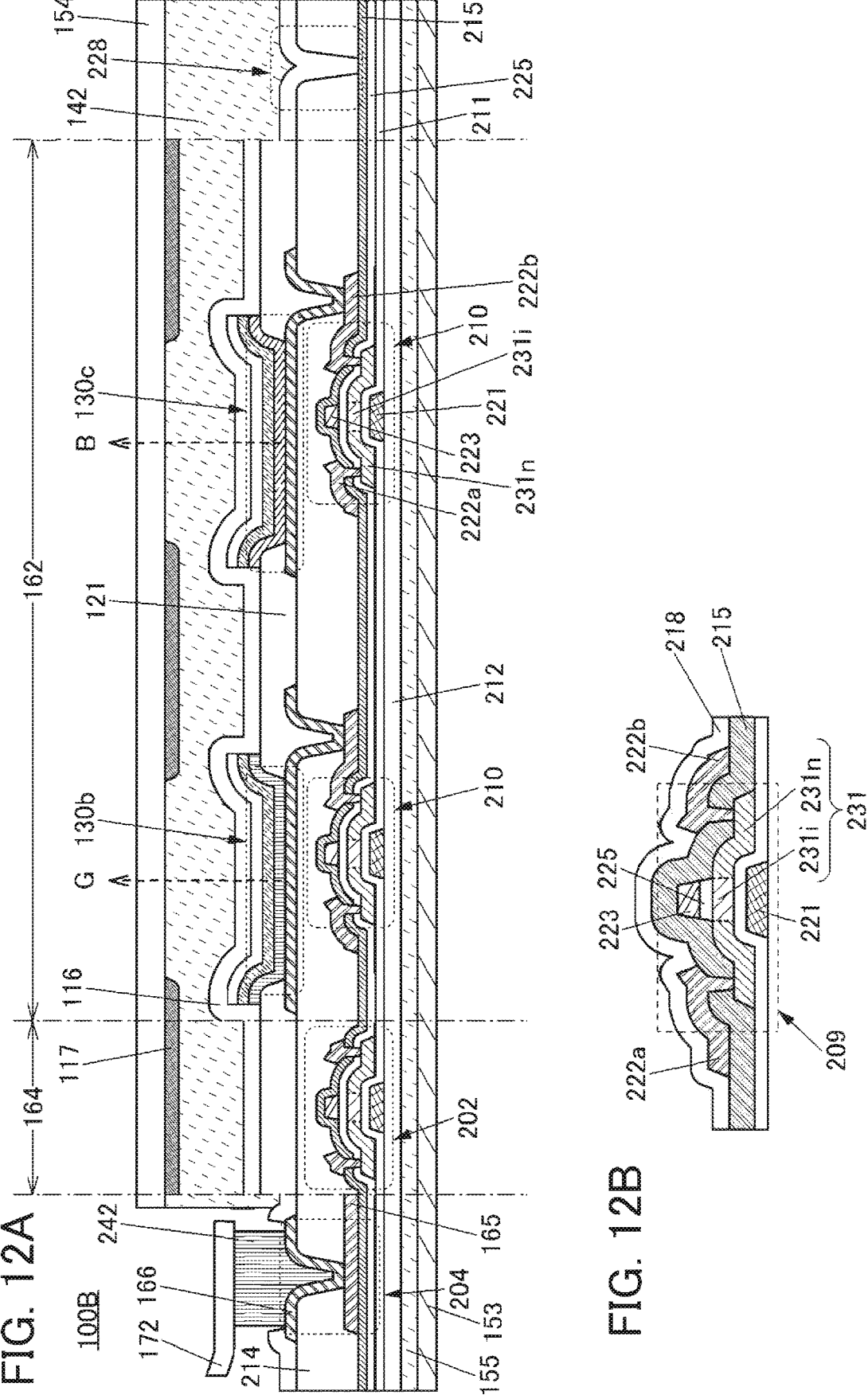
FIG. 12A is a cross-sectional view illustrating an example of a display apparatus.
FIG. 12B is a cross-sectional view illustrating an example of a transistor.

FIG. 12A is a cross-sectional view of a display apparatus 100B. A perspective view of the display apparatus 100B is similar to that of the display apparatus 100A (FIG. 10). FIG. 12A illustrates an example of cross sections of part of a region including the FPC 172, part of the circuit 164, and part of the display portion 162 in the display apparatus 100B. FIG. 12A specifically shows an example of a cross section of a region including the light-emitting device 130b, which emits green light, and the light-emitting device 130c, which emits blue light, in the display portion 162. Note that portions similar to those in the display apparatus 100A are not described in some cases.

The display apparatus 100B illustrated in FIG. 12A includes a transistor 202, transistors 210, the light-emitting device 130b, the light-emitting device 130c, and the like between the substrate 153 and the substrate 154.

The substrate 154 and the protective layer 116 are bonded to each other with the adhesive layer 142. The adhesive layer 142 is provided so as to overlap with the light-emitting device 130b and the light-emitting device 130c; that is, the display apparatus 100B employs a solid sealing structure.

The substrate 153 and an insulating layer 212 are bonded to each other with an adhesive layer 155.

As a method for manufacturing the display apparatus 100B, first, a formation substrate provided with the insulating layer 212, the transistors, the light-emitting devices, and the like and the substrate 154 provided with the light-blocking layer 117 are bonded to each other with the adhesive layer 142. Then, the substrate 153 is attached to a surface exposed by separation of the formation substrate, whereby the components formed over the formation substrate are transferred to the substrate 153. The substrate 153 and the substrate 154 are preferably flexible. Accordingly, the display apparatus 100B can be highly flexible.

The inorganic insulating film that can be used as the insulating layer 211, the insulating layer 213, and the insulating layer 215 can be used as the insulating layer 212.

The light-emitting devices 130b and 130c each have the same structure as the stacked-layer structure illustrated in FIG. 6A.

The pixel electrode is connected to the conductive layer 222b included in the transistor 210 through the opening provided in the insulating layer 214. The conductive layer 222b is connected to a low-resistance region 231n through an opening provided in the insulating layer 215 and the insulating layer 225. The transistor 210 has a function of controlling the driving of the light-emitting device.

An end portion of the pixel electrode is covered with the insulating layer 121.

Light from the light-emitting devices 130b and 130c is emitted toward the substrate 154. For the substrate 154, a material having a high visible-light-transmitting property is preferably used.

A connection portion 204 is provided in a region of the substrate 153 where the substrate 154 does not overlap. In the connection portion 204, the wiring 165 is electrically connected to the FPC 172 through the conductive layer 166 and the connection layer 242. The conductive layer 166 can be obtained by processing the same conductive film as the pixel electrode. Thus, the connection portion 204 and the FPC 172 can be electrically connected to each other through the connection layer 242.

The transistor 202 and the transistor 210 each include the conductive layer 221 functioning as a gate, the insulating layer 211 functioning as a gate insulating layer, a semiconductor layer including a channel formation region 231i and a pair of low-resistance regions 231n, the conductive layer 222a connected to one of the low-resistance regions 231n, the conductive layer 222b connected to the other low-resistance region 231n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between the conductive layer 223 and the channel formation region 231*i*.

The conductive layer 222*a* and the conductive layer 222*b* are connected to the corresponding low-resistance regions 231*n* through openings provided in the insulating layer 215. One of the conductive layers 222*a* and 222*b* serves as a source, and the other serves as a drain.

FIG. 12A illustrates an example in which the insulating layer 225 covers a top and side surfaces of the semiconductor layer. The conductive layer 222*a* and the conductive layer 222*b* are each connected to the corresponding low-resistance region 231*n* through openings provided in the insulating layer 225 and the insulating layer 215.

In a transistor 209 illustrated in FIG. 12B, the insulating layer 225 overlaps with the channel formation region 231*i* of the semiconductor layer 231 and does not overlap with the low-resistance regions 231*n*. The structure illustrated in FIG. 12B is obtained by processing the insulating layer 225 with the conductive layer 223 as a mask, for example. In FIG. 12B, the insulating layer 215 is provided to cover the insulating layer 225 and the conductive layer 223, and the conductive layer 222*a* and the conductive layer 222*b* are connected to the low-resistance regions 231*n* through the openings in the insulating layer 215. Furthermore, an insulating layer 218 covering the transistor may be provided.

This embodiment can be combined with the other embodiments as appropriate.

Embodiment 3

In this embodiment, a display apparatus of one embodiment of the present invention will be described with reference to FIG. 13 to FIG. 16.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head mounted display and a glasses-type AR device.

[Display Module]

Figure 13A:
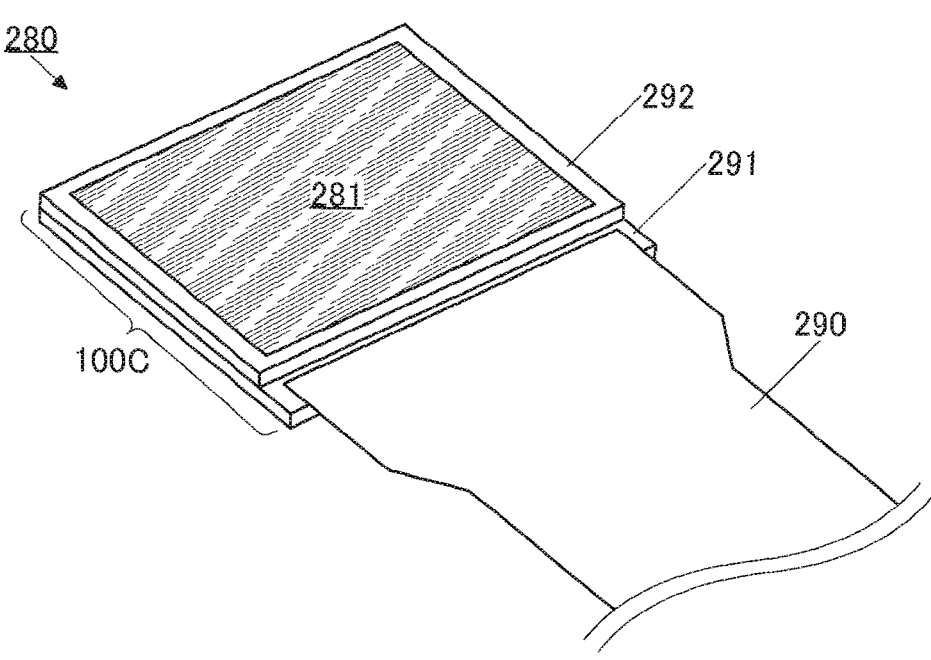
FIG. 13A and FIG. 13B are perspective views illustrating an example of a display module.

FIG. 13A is a perspective view of a display module 280. The display module 280 includes a display apparatus 100C and an FPC 290. Note that the display apparatus included in the display module 280 is not limited to the display apparatus 100C and may be a display apparatus 100D or a display apparatus 100E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 13B:
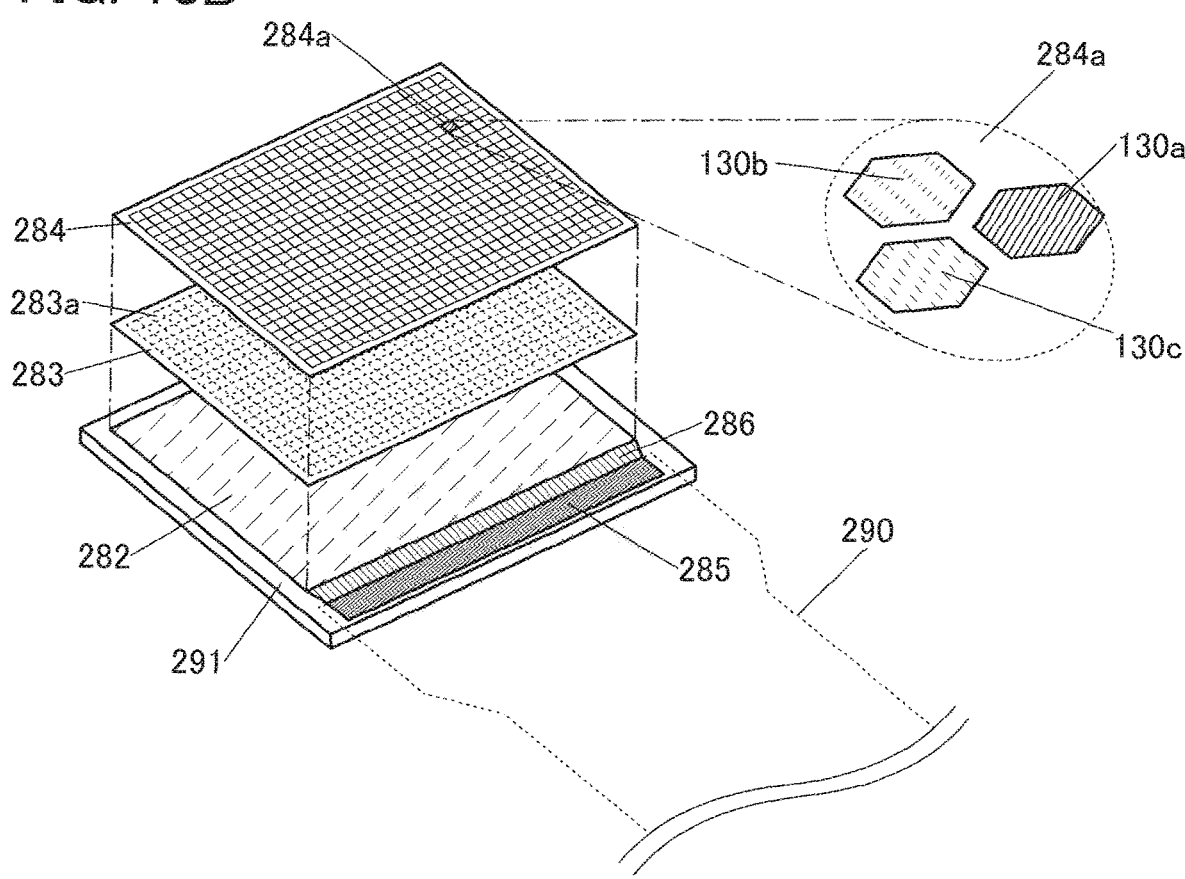

FIG. 13B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that is not overlapped by the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side of FIG. 13B. The pixel 284*a* includes the light-emitting devices 130*a*, 130*b*, and 130*c* that emit light of different colors from each other. A plurality of light-emitting devices may be arranged in a delta pattern as illustrated in FIG. 13B. With the delta pattern that enables high-density arrangement of pixel circuits, a high-resolution display apparatus can be provided. Alternatively, a variety of arrangement methods, such as stripe arrangement or pentile arrangement, can be employed.

The pixel circuit portion 283 includes a plurality of pixel circuits 283*a* arranged periodically.

One pixel circuit 283*a* is a circuit that controls light emission of three light-emitting devices included in one pixel 284*a*. One pixel circuit 283*a* may be provided with three circuits each of which controls light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to one of a source and a drain of the selection transistor. Thus, an active-matrix display apparatus is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are provided to be stacked below the pixel portion 284; hence, the aperture ratio (effective display area ratio) of the display portion 281 can be significantly high. For example, the aperture ratio of the display portion 281 can be greater than or equal to % and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 100C]

Figure 14:
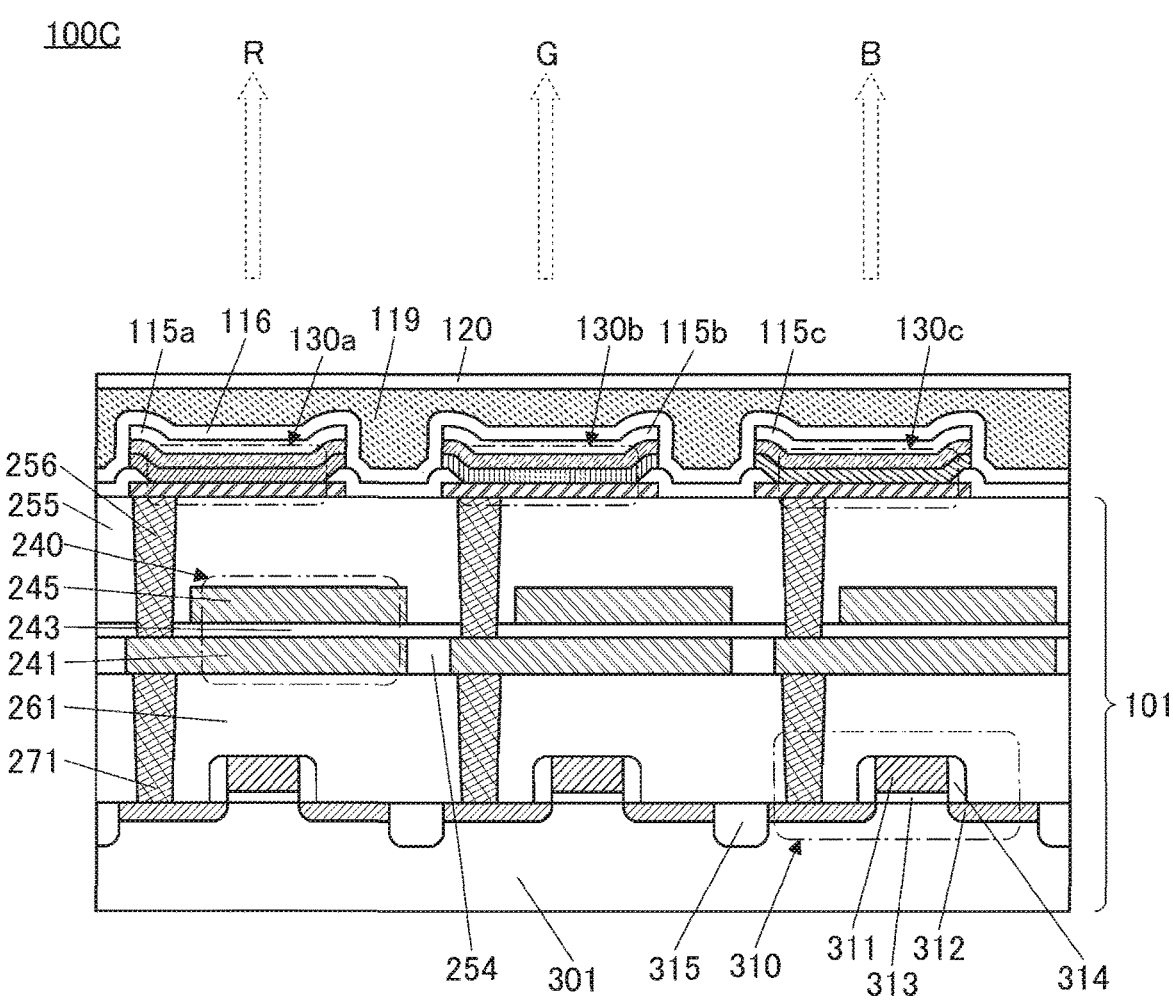
FIG. 14 is a cross-sectional view illustrating an example of a display apparatus.

The display apparatus 100C illustrated in FIG. 14 includes a substrate 301, the light-emitting devices 130a, 130b and 130c, a capacitor 240, and a transistor 310.

The substrate 301 corresponds to the substrate 291 illustrated in FIG. 13A and FIG. 13B. A stacked-layer structure including the substrate 301 and the components thereover up to an insulating layer 255 corresponds to the layer 101 including transistors in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover a side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

An insulating layer 255 is provided to cover the capacitor 240. The light-emitting devices 130a, 130b, and 130c and the like are provided over the insulating layer 255. This embodiment shows an example in which the light-emitting devices 130a, 130b, and 130c have the same structure as the stacked-layer structure illustrated in FIG. 6A. Furthermore, the protective layers 115a, 115b, and 115c are provided over the light-emitting devices 130a, 130b, and 130c, respectively. The protective layer 116 is provided over the protective layers 115a, 115b, and 115c, and the substrate 120 is bonded to the protective layer 116 with the resin layer 119. Embodiment 1 can be referred to for details of the light-emitting devices and the components thereover up to the substrate 120. The substrate 120 corresponds to the substrate 292 in FIG. 13A.

The pixel electrode of the light-emitting device is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Apparatus 100D]

Figure 15:
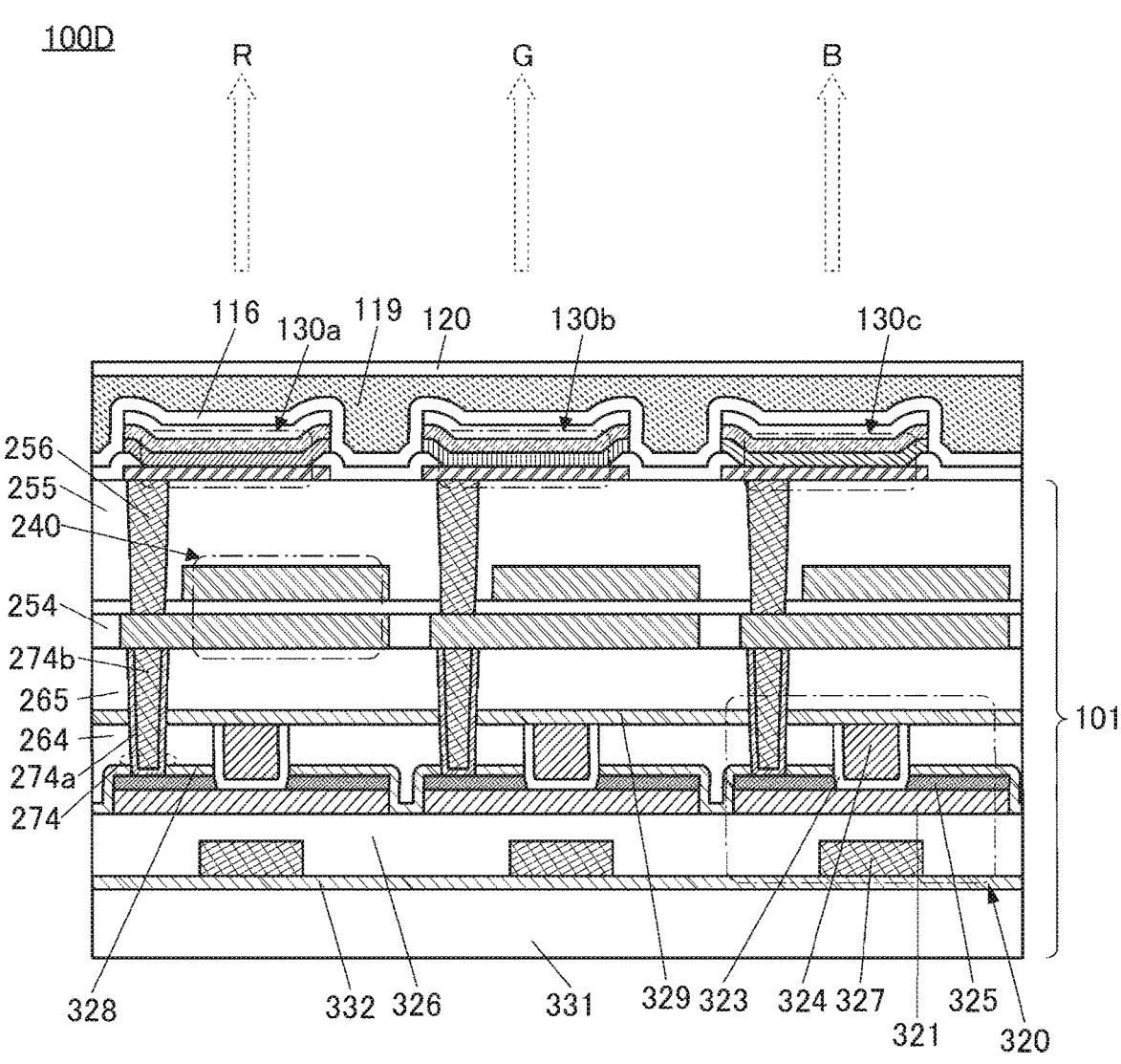
FIG. 15 is a cross-sectional view illustrating an example of a display apparatus.

The display apparatus 100D illustrated in FIG. 15 differs from the display apparatus 100C mainly in a structure of a transistor. Note that portions similar to those in the display apparatus 100C are not described in some cases.

A transistor 320 is a transistor that contains a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 13A and FIG. 13B. A stacked-layer structure including the substrate 331 and the components thereover up to the insulating layer 255 corresponds to the layer 101 including transistors in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film in which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide (also referred to as an oxide semiconductor) film having semiconductor characteristics is preferably used as the semiconductor layer 321. A material that can be used for the semiconductor layer 321 will be described in detail later.

The pair of conductive layers 325 are provided on and in contact with the semiconductor layer 321 and function as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with side surfaces of the insulating layers 264 and 328 and the conductive layer 325 and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and insulating layers 329 and 265 are provided to cover these layers.

The insulating layers 264 and 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274a that covers a side surface of an opening formed in the insulating layers 265, 329, 264, and 328 and part of the top surface of the conductive layer 325, and a conductive layer 274b in contact with the top surface of the conductive layer 274a. For the conductive layer 274a, a conductive material in which hydrogen and oxygen are less likely to diffuse is preferably used.

The structures of the insulating layer 254 and the components thereover up to the substrate 120 in the display apparatus 100D are similar to those in the display apparatus 100C.

[Display Apparatus 100E]

Figure 16:
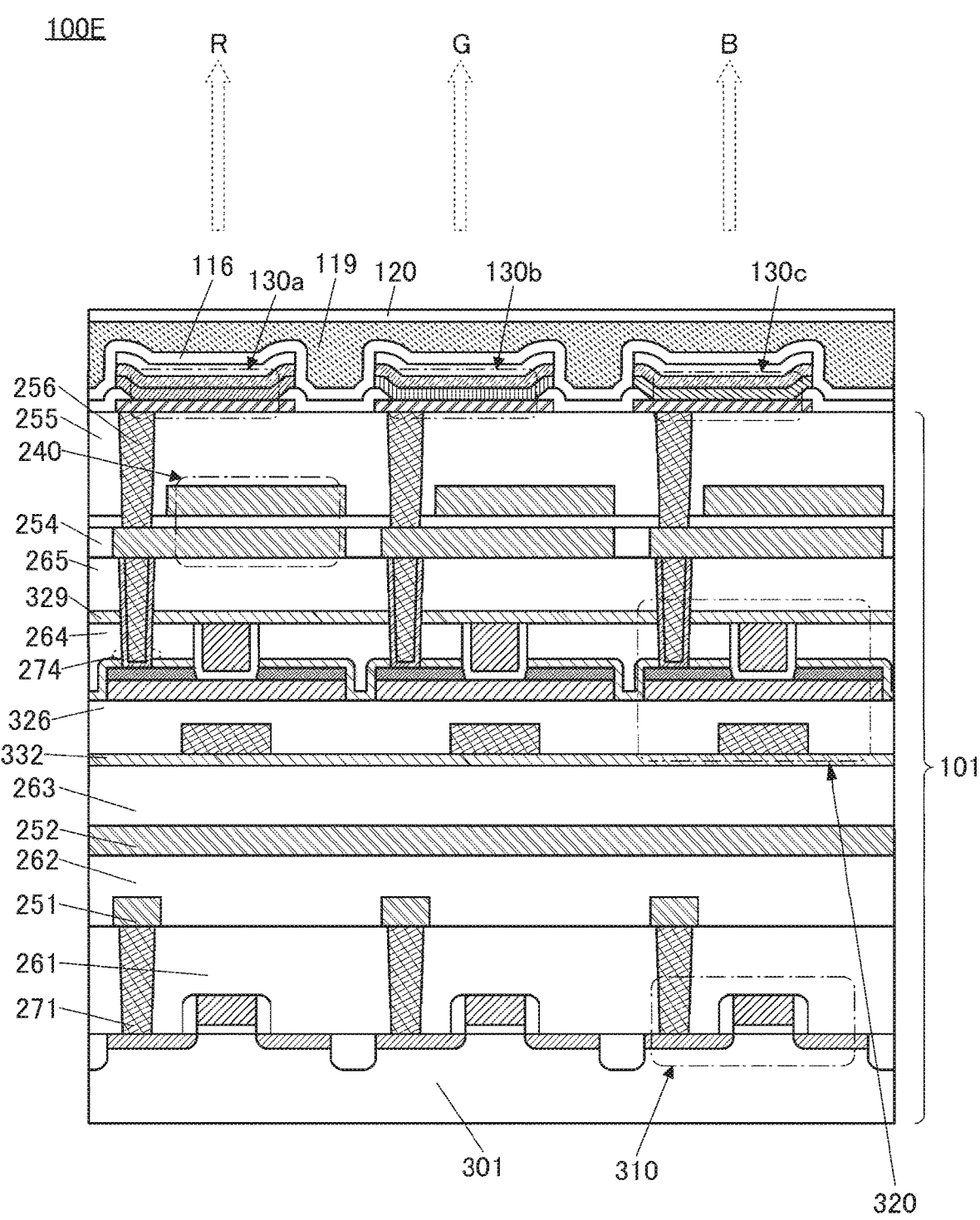
FIG. 16 is a cross-sectional view illustrating an example of a display apparatus.

The display apparatus 100E illustrated in FIG. 16 has a structure in which the transistor 310 whose channel is formed in the substrate 301 and the transistor 320 including a metal oxide in the semiconductor layer where the channel is formed are stacked. Note that portions similar to those in the display apparatuses 100C and 100D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display region.

This embodiment can be combined with the other embodiments as appropriate.

Embodiment 4

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC- OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta/2\theta$ scanning, for example, a peak indicating c-axis alignment is detected at $2\theta$ of $31°$ or around $31°$. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS. Moreover, the second region has [Ga] higher than that in the composition of the CAC-OS. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility ($\mu$) and excellent switching operation can be achieved.

A transistor using the CAC-OS has high reliability. Thus, the CAC-OS is most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-1}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given.

This embodiment can be combined with the other embodiments as appropriate.

Embodiment 5

In this embodiment, a display module of one embodiment of the present invention will be described with reference to FIG. 17.

Figures 17A, 17B:
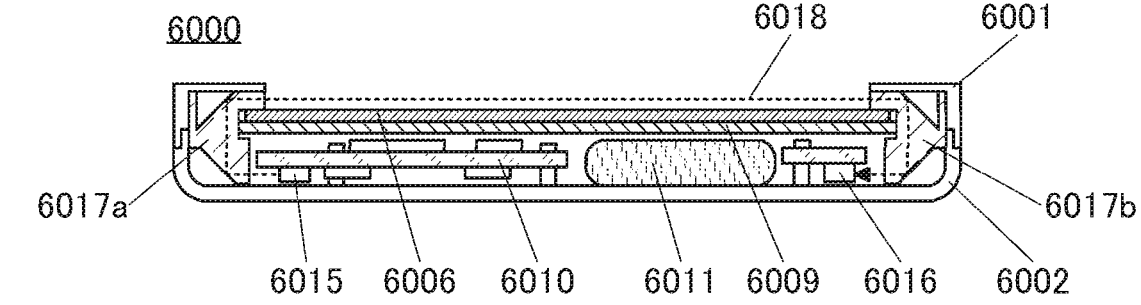
FIG. 17A and FIG. 17B are diagrams illustrating an example of an electronic device.

In a display module 6000 illustrated in FIG. 17A, a display apparatus 6006 to which an FPC 6005 is connected, a frame 6009, a printed circuit board 6010, and a battery 6011 are provided between an upper cover 6001 and a lower cover 6002.

The display apparatus of one embodiment of the present invention can be used for the display apparatus 6006. With the display apparatus 6006, a highly reliable display module can be provided.

The shape and size of the upper cover 6001 and the lower cover 6002 can be changed as appropriate in accordance with the size of the display apparatus 6006.

The display apparatus 6006 may have a function of a touch panel. Alternatively, the display module 6000 may include a touch panel in addition to the display apparatus 6006.

The frame 6009 may have a function of protecting the display apparatus 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. A power source for supplying electric power to the power supply circuit may be an external commercial power source or the separately provided battery 6011.

FIG. 17B is a schematic cross-sectional view of the display module 6000 with an optical touch sensor.

The display module 6000 includes a light-emitting portion 6015 and a light-receiving portion 6016 which are provided on the printed circuit board 6010. Furthermore, a pair of light guide portions (a light guide portion 6017a and a light guide portion 6017b) are provided in a region surrounded by the upper cover 6001 and the lower cover 6002.

The display apparatus 6006 overlaps with the printed circuit board 6010 and the battery 6011 with the frame 6009 located therebetween. The display apparatus 6006 and the frame 6009 are fixed to the light guide portion 6017a and the light guide portion 6017b.

Light 6018 emitted from the light-emitting portion 6015 travels over the display apparatus 6006 through the light guide portion 6017a and reaches the light-receiving portion 6016 through the light guide portion 6017b. For example, blocking of the light 6018 by a sensing target such as a finger or a stylus enables detection of touch operation.

A plurality of the light-emitting portions 6015 are provided along two adjacent sides of the display apparatus 6006, for example. A plurality of the light-receiving portions 6016 are provided so as to face the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electrical signal can be used. A photodiode that can receive infrared rays can be favorably used.

With the use of the light guide portion 6017*a* and the light guide portion 6017*b* which transmit the light 6018, the light-emitting portion 6015 and the light-receiving portion 6016 can be placed under the display apparatus 6006, and a malfunction of the touch sensor due to external light reaching the light-receiving portion 6016 can be suppressed. Particularly when a resin which absorbs visible light and transmits infrared rays is used for the light guide portion 6017*a* and the light guide portion 6017*b*, a malfunction of the touch sensor can be more effectively inhibited.

This embodiment can be combined with the other embodiments as appropriate.

Embodiment 6

In this embodiment, electronic devices of one embodiment of the present invention are described with reference to FIG. 18 to FIG. 21.

An electronic device in this embodiment includes the display apparatus of one embodiment of the present invention. For the display apparatus of one embodiment of the present invention, increases in resolution, definition, and sizes are easily achieved. Thus, the display apparatus of one embodiment of the present invention can be used for display portions of a variety of electronic devices.

The display apparatus of one embodiment of the present invention can be manufactured at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine (e.g., a pachinko machine); a camera such as a digital camera or a digital video camera; a digital photo frame; a mobile phone; a portable game console; a portable information terminal; and an audio reproducing device.

In particular, a display apparatus of one embodiment of the present invention can have a high resolution, and thus can be favorably used for an electronic device having a relatively small display portion. As such an electronic device, a watch-type or bracelet-type information terminal device (wearable device); and a wearable device worn on a head, such as a device for VR such as a head mounted display and a glasses-type device for AR can be given, for example. Examples of wearable devices include a device for SR and a device for MR.

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (definition) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display apparatus with high resolution and high definition, the electronic device can have higher realistic sensation, sense of depth, and the like in personal use such as portable use and home use.

The electronic device in this embodiment can be incorporated along a curved surface of an inside wall or an outside wall of a house or a building or the interior or the exterior of a car.

The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figures 18A, 18B:
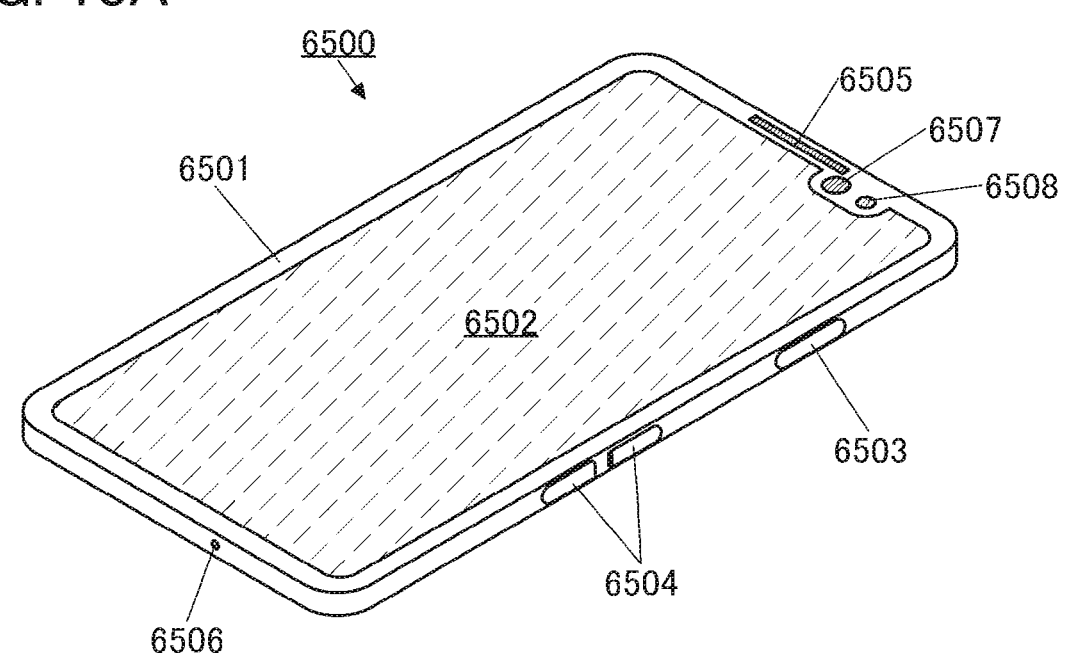
FIG. 18A and FIG. 18B are diagrams illustrating an example of an electronic device.

An electronic device 6500 in FIG. 18A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

FIG. 18B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted while the thickness of the electronic device is controlled. Moreover, part of the display panel 6511 is folded back so that a connection portion with the FPC 6515 is provided on the back side of the pixel portion, whereby an electronic device with a narrow bezel can be achieved.

FIG. 19A illustrates an example of a television device. In a television device 7100, a display portion 7000 is incorporated in a housing 7101. Here, the housing 7101 is supported by a stand 7103.

The display apparatus of one embodiment of the present invention can be used for the display portion 7000.

Operation of the television device 7100 illustrated in FIG. 19A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 19B illustrates an example of a laptop personal computer. The laptop personal computer 7200 includes a housing 7211, a keyboard 7212, a pointing device 7213, an external connection port 7214, and the like. In the housing 7211, the display portion 7000 is incorporated.

The display apparatus of one embodiment of the present invention can be used for the display portion 7000.

FIGS. 19C and 19D illustrate examples of digital signage.

A digital signage 7300 illustrated in FIG. 19C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 19D illustrates a digital signage 7400 mounted on a cylindrical pillar 7401. The digital signage 7400 includes the display portion 7000 provided along a curved surface of the pillar 7401.

The display apparatus of one embodiment of the present invention can be used in the display portion 7000 illustrated in each of FIG. 19C and FIG. 19D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 19C and FIG. 19D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

FIG. 20A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 by a mount for engagement with the mount of the camera 8000. The finder 8100 can display a video received from the camera 8000 and the like on the display portion 8102.

The button 8103 functions as a power supply button or the like.

A display apparatus of one embodiment of the present invention can be used in the display portion 8002 of the camera 8000 and the display portion 8102 of the finder 8100. Note that a finder may be incorporated in the camera 8000.

FIG. 20B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like to receive image data and display it on the display portion 8204. The main body 8203 includes a camera, and data on the movement of the eyeballs or the eyelids of the user can be used as an input means.

The mounting portion 8201 may include a plurality of electrodes capable of sensing current flowing accompanying with the movement of the user's eyeball at a position in contact with the user to recognize the user's sight line. The mounting portion 8201 may also have a function of monitoring the user's pulse with use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display apparatus of one embodiment of the present invention can be used in the display portion 8204.

FIG. 20C to FIG. 20E are external views of a head-mounted display 8300. The head-mounted display 8300 includes the housing 8301, the display portion 8302, the band-like fixing member 8304, and a pair of lenses 8305.

A user can see display on the display portion 8302 through the lenses 8305. The display portion 8302 is preferably curved so that the user can feel high realistic sensation.

Another image displayed in another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display apparatus of one embodiment of the present invention can be used for the display portion 8302. The display apparatus of one embodiment of the present invention achieves extremely high resolution. For example, a pixel is not easily seen by the user even when the user sees display that is magnified by the use of the lenses 8305 as illustrated in FIG. 20E. In other words, a video with a strong sense of reality can be seen by the user with use of the display portion 8302.

FIG. 20F is an external view of a google-type head-mounted display 8400. The head-mounted display 8400 includes a pair of housings 8401, a mounting portion 8402, and a cushion 8403. A display portion 8404 and a lens 8405 are provided in each of the pair of housings 8401. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has flexibility and elasticity so as to be adjusted to fit the size of the user's face and not to slide down. In addition, part of the mounting portion 8402 preferably has a vibration mechanism functioning as a bone conduction earphone. Thus, audio devices such as an earphone and a speaker are not necessarily provided separately, and the user can enjoy images and sounds only when wearing the head-mounted display 8400. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable in order to easily perform cleaning or replacement.

Electronic devices illustrated in FIG. 21A to FIG. 21F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 21A to FIG. 21F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display apparatus of one embodiment of the present invention can be used for the display portion 9001.

The electronic devices illustrated in FIG. 21A to FIG. 21F will be described in detail below.

Figure 21A:
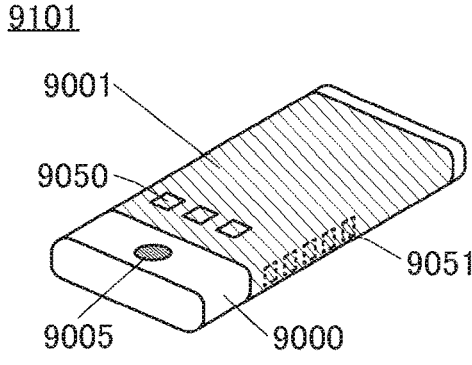
FIG. 21A to FIG. 21F are diagrams illustrating examples of electronic devices.

FIG. 21A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 21A illustrates an example in which three icons 9050 are displayed. Furthermore, information 9051 indicated by dashed rectangles can be displayed on another surface of the display portion 9001. Examples of the information 9051 include notification of reception of an e-mail, an SNS (social networking service) message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 21B:
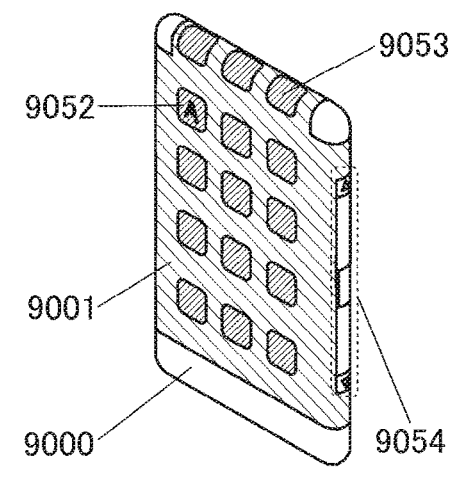

FIG. 21B is a perspective view showing a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 21C:
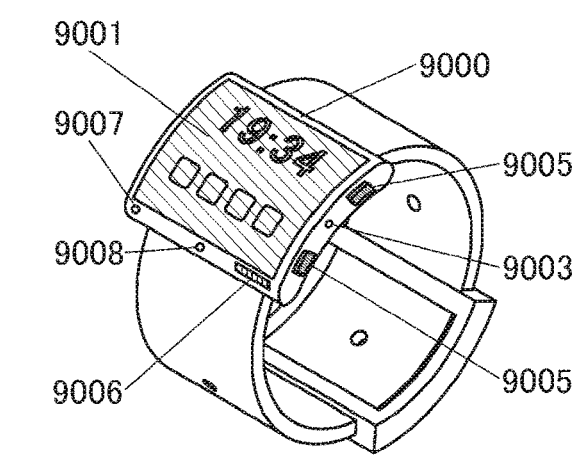

FIG. 21C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 21D:
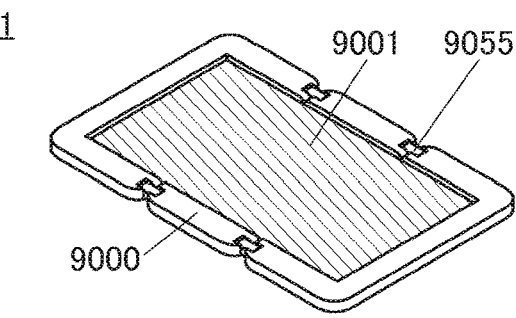
Figure 21E:
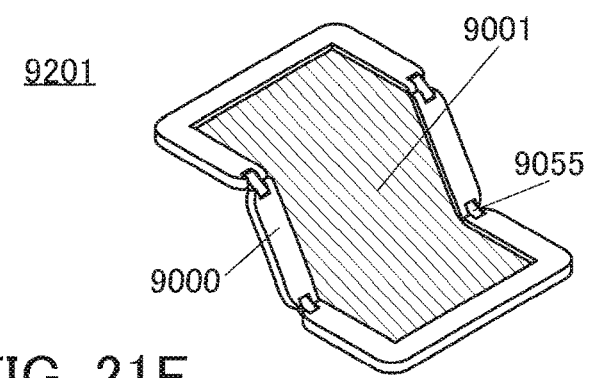
Figure 21F:
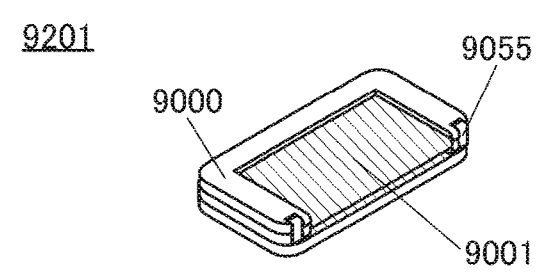

FIG. 21D to FIG. 21F are perspective views illustrating a foldable portable information terminal 9201. FIG. 21D is a perspective view of an opened state of the portable information terminal 9201, FIG. 21F is a perspective view of a folded state thereof, and FIG. 21E is a perspective view of a state in the middle of change from one of FIG. 21D and FIG. 21F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

This embodiment can be combined with the other embodiments as appropriate.

REFERENCE NUMERALS

100A: display apparatus, 100B: display apparatus, 100C: display apparatus, 100D: display apparatus, 100E: display apparatus, 101: layer including transistors, 105: insulating layer, 110: substrate, 111a: pixel electrode, 111b: pixel electrode, 111c: pixel electrode, 113a: EL layer, 113b: EL layer, 113c: EL layer, 114a: counter electrode, 114b: counter electrode, 114c: counter electrode, 115a: protective layer, 115b: protective layer, 115c: protective layer, 116a: inorganic insulating layer, 116b: organic insulating layer, 116c: inorganic insulating layer, 116: protective layer, 117: light-blocking layer, 119: resin layer, 120: substrate, 121a: region, 121b: region, 121c: region, 121: insulating layer, 122a: transistor, 122b: transistor, 122c: transistor, 125a: protective layer, 125b: protective layer, 125c: protective layer, 126a: optical adjustment layer, 126b: optical adjustment layer, 126c: optical adjustment layer, 130a: light-emitting device, 130b: light-emitting device, 130c: light-emitting device, 142: adhesive layer, 143: space, 151: substrate, 152: substrate, 153: substrate, 154: substrate, 155: adhesive layer, 162: display portion, 164: circuit, 165: wiring, 166: conductive layer, 172: FPC, 173: IC, 190a: metal mask, 190b: metal mask, 190c: metal mask, 191: resist film, 192: resist mask, 201: transistor, 202: transistor, 204: connection portion, 205: transistor, 209: transistor, 210: transistor, 211: insulating layer, 212: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231i: channel formation region, 231n: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274a: conductive layer, 274b: conductive layer, 274: plug, 280: display module, 281: display portion, 282: circuit portion, 283a: pixel circuit, 283: pixel circuit portion, 284a: pixel, 284: pixel portion, 285: terminal portion, 286: wiring portion, 290: FPC, 291: substrate, 292: substrate, 301: substrate, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 331: substrate, 332: insulating layer, 6000: display module, 6001: upper cover, 6002: lower cover, 6005: FPC, 6006: display apparatus, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: mounting portion, 8403: cushion, 8404: display portion, 8405: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A method for manufacturing a display apparatus, comprising:

forming a first pixel electrode and a second pixel electrode;

forming an insulating layer covering an end portion of the first pixel electrode and an end portion of the second pixel electrode;

forming a first layer over the first pixel electrode, the second pixel electrode, and the insulating layer;

placing a first metal mask comprising a first opening over the first layer so that the first opening overlaps the first pixel electrode;

forming a first counter electrode overlapping the first pixel electrode with the first layer therebetween by performing film deposition with the first metal mask;

removing at least part of a region overlapping the second pixel electrode of the first layer using the first counter electrode as a hard mask;

forming a second layer over the first pixel electrode, the second pixel electrode, and the insulating layer;

placing a second metal mask comprising a second opening over the second layer so that the second opening overlaps the second pixel electrode;

forming a second counter electrode overlapping the second pixel electrode with the second layer therebetween by performing film deposition with the second metal mask;

removing at least part of a region overlapping the first pixel electrode of the second layer using the second counter electrode as a hard mask;

forming, over the first counter electrode and the second counter electrode, a resist mask comprising an opening at a position overlapping the insulating layer;

exposing part of the insulating layer by removing at least part of a region overlapping the insulating layer of at least one of the first layer, the second layer, the first counter electrode, and the second counter electrode using the resist mask; and forming a first protective layer covering the first counter electrode, the second counter electrode, and the insulating layer.

2. The method for manufacturing a display apparatus according to claim 1, further comprising:

before the formation of the first counter electrode, forming a second protective layer overlapping the first pixel electrode with the first layer therebetween by performing film deposition with the first metal mask; and before the formation of the second counter electrode, forming a third protective layer overlapping the second pixel electrode with the second layer therebetween by performing film deposition with the second metal mask.

3. The method for manufacturing a display apparatus according to claim 2, wherein a thickness of the second protective layer and a thickness of the third protective layer are different from each other.

4. The method for manufacturing a display apparatus according to claim 2, wherein at least one of a metal oxide layer comprising indium, gallium, and zinc and a metal oxide layer comprising indium and tin is formed as each of the second protective layer and the third protective layer.

5. The method for manufacturing a display apparatus according to claim 1, further comprising:

after the formation of the first counter electrode, forming a fourth protective layer overlapping the first pixel electrode with the first counter electrode therebetween by performing film deposition with the first metal mask.

6. The method for manufacturing a display apparatus according to claim 5, wherein at least one of a metal oxide layer comprising indium, gallium, and zinc and a metal oxide layer comprising indium and tin is formed as the fourth protective layer.

7. A method for manufacturing a display apparatus, comprising:

forming a first pixel electrode and a second pixel electrode;

forming an insulating layer covering an end portion of the first pixel electrode and an end portion of the second pixel electrode;

forming a first layer over the first pixel electrode, the second pixel electrode, and the insulating layer;

forming a first counter electrode over the first layer;

placing a first metal mask comprising a first opening over the first counter electrode so that the first opening overlaps the second pixel electrode;

removing at least part of a region overlapping the second pixel electrode of the first layer and the first counter electrode using the first metal mask;

forming a second layer over the first pixel electrode, the second pixel electrode, and the insulating layer;

forming a second counter electrode over the second layer;

placing a second metal mask comprising a second opening over the second counter electrode so that the second opening overlaps the first pixel electrode;

removing at least part of a region overlapping the first pixel electrode of the second layer and the second counter electrode using the second metal mask;

forming, over the first counter electrode and the second counter electrode, a resist mask comprising an opening at a position overlapping the insulating layer;

exposing part of the insulating layer by removing at least part of a region overlapping the insulating layer of at least one of the first layer, the second layer, the first counter electrode, and the second counter electrode using the resist mask; and forming a first protective layer covering the first counter electrode, the second counter electrode, and the insulating layer.

8. The method for manufacturing a display apparatus according to claim 7, further comprising:

forming a second protective layer over the first layer before the formation of the first counter electrode; and forming a third protective layer over the second layer before the formation of the second counter electrode.

9. The method for manufacturing a display apparatus according to claim 8, wherein a thickness of the second protective layer and a thickness of the third protective layer are different from each other.

10. The method for manufacturing a display apparatus according to claim 8, wherein at least one of a metal oxide layer comprising indium, gallium, and zinc and a metal oxide layer comprising indium and tin is formed as each of the second protective layer and the third protective layer.

11. The method for manufacturing a display apparatus according to claim 7, further comprising:

forming a fourth protective layer over the first counter electrode before the placement of the first metal mask.

12. The method for manufacturing a display apparatus according to claim 11, wherein at least one of a metal oxide layer comprising indium, gallium, and zinc and a metal oxide layer comprising indium and tin is formed as the fourth protective layer.

* * * * *